US006900540B1

(12) United States Patent
Teig et al.

(10) Patent No.: US 6,900,540 B1
(45) Date of Patent: May 31, 2005

(54) SIMULATING DIAGONAL WIRING DIRECTIONS USING MANHATTAN DIRECTIONAL WIRES

(75) Inventors: Steven Teig, Menlo Park, CA (US); David Overhauser, Sunnyvale, CA (US); Akira Fujimura, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 32 days.

(21) Appl. No.: 10/043,853

(22) Filed: Jan. 11, 2002

Related U.S. Application Data

(63) Continuation of application No. 09/681,776, filed on Jun. 3, 2001, now Pat. No. 6,858,939, which is a continuation of application No. 09/733,104, filed on Dec. 7, 2000, now Pat. No. 6,858,928.

(51) Int. Cl.[7] .................. H01L 23/48; H01L 23/52; H01L 29/40; G06F 17/50
(52) U.S. Cl. .................. 257/758; 257/700; 257/701; 257/208; 257/211; 257/207; 257/203; 257/48; 257/459; 257/775; 257/776; 257/200; 257/210; 257/206; 364/489; 364/488; 716/2; 716/7; 716/1; 361/735; 29/850; 438/197; 438/33; 438/113
(58) Field of Search .................. 257/758, 700, 257/701, 203, 206–211, 300, 776, 773, 200, 778, 775, 369, 401, 315, 72, 786, 648, 676, 770, 349, 800, 209; 716/1–21; 361/735; 345/443; 438/197, 33, 113; 29/850

(56) References Cited

U.S. PATENT DOCUMENTS

| | | | | |
|---|---|---|---|---|
| 4,782,193 A | * | 11/1988 | Linsker | 174/261 |
| 4,855,253 A | * | 8/1989 | Weber | 438/18 |
| 5,541,005 A | * | 7/1996 | Bezama et al. | 428/551 |
| 5,635,736 A | * | 6/1997 | Funaki et al. | 257/202 |
| 5,637,920 A | * | 6/1997 | Loo | 257/700 |
| 5,640,327 A | | 6/1997 | Ting | |
| 5,646,830 A | * | 7/1997 | Nagano | 361/813 |
| 5,650,653 A | * | 7/1997 | Rostoker et al. | 257/369 |
| 5,689,433 A | | 11/1997 | Edwards | |
| 5,723,908 A | * | 3/1998 | Fuchida et al. | 257/758 |
| 5,784,289 A | * | 7/1998 | Wang | 716/8 |
| 5,801,385 A | | 9/1998 | Endo et al. | |
| 5,811,863 A | * | 9/1998 | Rostoker et al. | 257/401 |

(Continued)

FOREIGN PATENT DOCUMENTS

| | | |
|---|---|---|
| JP | 04-000677 | 1/1992 |
| JP | 04000677 A * | 1/1992 |
| JP | 2000-082743 | 3/2000 |

OTHER PUBLICATIONS

Schiele et al., "A Gridless Router for Industrial Design Rules", 1990, Design Automation Conference, Proceedings, 27th ACM/ISSS, pp. 626–631.*

(Continued)

Primary Examiner—Alexander Oscar Williams
(74) Attorney, Agent, or Firm—Stattler, Johansen, and Adeli LLP

(57) ABSTRACT

An integrated circuit has a metal layer that includes conductors to provide interconnectivity for components of the integrated circuit chip. The metal layer is divided into at least two sections, such that a first section has a preferred direction and the second section has a preferred wiring direction that is different from the first preferred direction. The first and second preferred directions on a single metal layer may consist of any direction. The metal layer may be divided into more than two sections, wherein each section has a preferred wiring direction. Wiring geometries for multi-level metal layers are also disclosed.

9 Claims, 24 Drawing Sheets

U.S. PATENT DOCUMENTS

| | | | | |
|---|---|---|---|---|
| 5,822,214 | A | * 10/1998 | Rostoker et al. | 716/10 |
| 5,880,969 | A | 3/1999 | Hama et al. | |
| 5,889,329 | A | 3/1999 | Rostoker et al. | |
| 5,980,093 | A | * 11/1999 | Jones et al. | 716/5 |
| 6,111,756 | A | 8/2000 | Moresco | |
| 6,150,193 | A | * 11/2000 | Glenn | 438/113 |
| 6,260,183 | B1 | 7/2001 | Raspopovic et al. | |
| 6,262,487 | B1 | * 7/2001 | Igarashi et al. | 257/758 |
| 6,263,475 | B1 | 7/2001 | Toyonaga et al. | |
| 6,301,686 | B1 | 10/2001 | Kikuchi et al. | |
| 6,307,256 | B1 | * 10/2001 | Chiang et al. | 257/668 |
| 6,316,838 | B1 | * 11/2001 | Ozawa et al. | 257/778 |
| 6,324,674 | B2 | 11/2001 | Andreev et al. | |
| 6,412,097 | B1 | 6/2002 | Kikuchi et al. | |
| 6,448,591 | B1 | * 9/2002 | Juengling | 257/211 |
| 6,516,455 | B1 | * 2/2003 | Teig et al. | 716/7 |
| 6,645,842 | B2 | 11/2003 | Igarashi et al. | |
| 2001/0009031 | A1 | 7/2001 | Nitta et al. | |
| 2002/0069397 | A1 | * 6/2002 | Teig et al. | 716/12 |
| 2003/0025205 | A1 | * 2/2003 | Shively | 257/758 |

OTHER PUBLICATIONS

Hongye Chen et al., "Physical Planning Of On–Chip Interconnect Architectures", 2002, IEEE, International Conference on, pp. 30–35.*

Chen et al., Optimal Algorithms for Bubble Sort Based Non–Manhattan Channel Routing, May 1994, Computer–Aided Design of Integrated Circuits and Systems, IEEE Transactions vol.: 13 Issues, pp. 603–609.

Cong J. et al., DUNE—A Multilayer Gridless Routing System, May 2001, IEEE Transactions on Computer–Aided Design of Integrated Circuits and Systems, vol. 20, iss. 5, pp. 633–647.

Dion J. et al., Contour: A Tile–based Gridless Router, Mar. 1995, Digital Western Research Laboratory, research Report 95/3, pp. 1–22.

Merriam–Webster's Collegiate Dictionary, $10^{th}$ edition, Merriam–Webster Incorporated, p. 606.

Morton, P. B. et al., An Efficient Sequential Quadratic Programming Formulation of Optimal Wire Spacing for Cross–Talk Noise Avoidance Routing, UCSC–CRL–99–05, Mar. 10, 1999.

NN71091316, Use of Relatively Diagonal And Rectangular Wiring Planes n Multilayer Packages, Sep. 1971, IBM Technical Disclosure Bulletin, vol. No. 14, Issue No. 4, pp. 1316–1317.

Royle, J. et al., Geometric Compaction in One Dimension for Channel Routing, $24^{th}$ ACM/IEEE Design Automation Conference, 1987, pp 140–145.

Tseng H. et al., A Gridless Multilayer Router for Standard Cell Circuits Using CTM Cells, Oct. 1999, IEEE Transactions on Computer–Aided Design of Integrated Circuits and Systems, vol. 18, iss. 10, pp. 1462–1479.

* cited by examiner

Octalinear (-45 Deg.)

Layer "n+1"

Octalinear (+45 Deg.)

Layer "n"

Octalinear (+45 Deg.)

Layer "n+1"

Octalinear (-45 Deg.)

Layer n (+60 Degrees)

(-60 Degrees)

Horizontal

Vertical

Horizontal

Layer 3
Vertical

Layer 2
Horizontal

Layer 1
Vertical

Layer 3

Vertical

Layer 2

Vertical

Layer 1

Horizontal

SIMULATING DIAGONAL WIRING DIRECTIONS USING MANHATTAN DIRECTIONAL WIRES

CROSS REFERENCE TO RELATED APPLICATIONS

This application is a continuation application of U.S. patent application Ser. No. 09/681,776, entitled "Diagonal Wiring Architecture For Integrated Circuit", filed on Jun. 3, 2001, now U.S. Pat. No. 6,858,939 which is a continuation application of U.S. patent application Ser. No. 09/733,104, entitled "Multi-Directional Wiring On A Single Metal Layer", filed on Dec. 7, 2000, now U.S. Pat. No. 6,858,928.

BACKGROUND OF INVENTION

An integrated circuit ("IC") is a semiconductor device that includes many electronic components (e.g., transistors, resistors, diodes, etc.). These components are often interconnected to form multiple circuit components (e.g., gates, cells, memory units, arithmetic units, controllers, decoders, etc.) on the IC. The electronic and circuit components of IC"s are jointly referred to below as "components."An IC also includes multiple layers of metal and/or polysilicon wiring that interconnect its electronic and circuit components. For instance, many ICs are currently fabricated with five metal layers. In theory, the wiring on the metal layers can be all-angle wiring (i.e., the wiring can be in any arbitrary direction). Such all-angle wiring is commonly referred to as Euclidean wiring. In practice, however, each metal layer typically has a preferred wiring direction, and the preferred direction alternates between successive metal layers. Many ICs use the Manhattan wiring model that specifies alternating layers of preferred-direction horizontal and vertical wiring. In this wiring model, the majority of the wires can only make 90° turns. However, occasional diagonal jogs are sometimes allowed on the preferred horizontal and vertical layers.

The distance of the wiring on the metal layers determines the propagation delay exhibited during operation of the circuit components. In turn, the propagation delay introduced in a circuit directly impacts the operational speed of the circuit (i.e., the greater the propagation delay the slower the operational speed of the circuit). The length of the wire determines the amount of propagation delay introduced into a circuit (i.e., the longer the wire the greater the propagation delay). In addition, when circuit connections are routed between metal layers, using mechanisms referred to as "vias", a significant amount of additional propagation delay is introduced. Accordingly, it is desirable to reduce the length of wires necessary to interconnect electronic components in an IC to reduce the propagation delay and to enhance the operational speed of the IC. It is also desirable to minimize the number of circuit connections routed between metal layers to further reduce the propagation delay.

SUMMARY OF THE INVENTION

Wiring geometries in metal layers use horizontal or vertical wires with a preferred diagonal direction. A "zag conductor", as used herein, is a Manhattan directional wirecoupled to a diagonal wire in a region with preferred diagonal wiring. In one embodiment, a metal layer has a region with an area of at least 100 microns. The region includes a plurality of preferred diagonal direction conductors and at least one zag conductor to interconnect points on the integrated circuit. The preferred diagonal direction conductors are deposed in a preferred diagonal direction, such that a preferred diagonal direction defines a direction relative to the boundaries of the integrated circuit. The zag conductor is deposed in a Manhattan direction, and is coupled to one of the preferred diagonal direction conductors so as to interconnect points on the integrated circuit using at least one zag conductor and at least one preferred diagonal direction conductor.

Diagonal wiring directions in integrated circuits are simulated with wires deposed in purely Manhattan directions (e.g., horizontal and vertical directions). A metal layer of an integrated circuit contains at least two pairs of conductors to interconnect one or more points on the integrated circuit. As used herein, a conductor comprises one or more wires, and a wire comprises a continuous segment deposed in a single direction. Each pair of conductors, used to simulate the wiring direction, includes two wires. The first wire, which has a first wire length with first and second ends, is deposed in a first Manhattan direction relative to the boundaries of the integrated circuit. The second wire, which has a second wire length with first and second ends, is deposed in a second Manhattan direction, and is coupled to the second end of the first wire. The first Manhattan direction is different than the second Manhattan direction. The effective wiring direction of the pairs of conductors comprises an angle, A, measured relative to the boundaries of the integrated circuit. Specifically, the effective wiring direction is defined by the expression Tan $A=Y/X$, wherein, Y defines a line segment with a distance that starts from the second end of the second wire in the last conductor pair and ends at an intersection with a line segment propagated from the first end of the first wire and in the direction of the first wire, and X comprises a distance, measured in the direction of the first wire, that starts from the first end of the first wire and ends with the intersection of the Y line segment.

The first Manhattan direction includes either a horizontal or vertical direction, and the second Manhattan direction includes either a horizontal or vertical direction, opposite from the first Manhattan direction. In one embodiment, the Manhattan directional wires are configured to simulate a 45 degree wiring direction, and, in another embodiment, the Manhattan directional wires are configured to simulate a 60 degree wiring direction. The pairs of conductors may be configured, essentially in parallel, to generate tracks of conductor on a metal layer in the simulated direction.

Diagonal wiring directions in integrated circuits are simulated with wires deposed in purely Manhattan directions (e.g., horizontal and vertical directions). A metal layer of an integrated circuit contains at least two pairs of conductors to interconnect one or more points on the integrated circuit. As used herein, a conductor comprises one or more wires, and a wire comprises a continuous segment deposed in a single direction. Each pair of conductors, used to simulate the wiring direction, includes two wires. The first wire, which has a first wire length with first and second ends, is deposed in a first Manhattan direction relative to the boundaries of the integrated circuit. The second wire, which has a second wire length with first and second ends, is deposed in a second Manhattan direction, and is coupled to the second end of the first wire. The first Manhattan direction is different than the second Manhattan direction. The effective wiring direction of the pairs of conductors comprises an angle, A, measured relative to the boundaries of the integrated circuit. Specifically, the effective wiring direction is defined by the expression Tan $A=Y/X$, wherein, Y defines a line segment with a distance that starts from the second end of the second wire in the last conductor pair and ends at an intersection with a line segment propagated from the first end of the first wire and in the direction of the first wire, and X comprises a distance, measured in the direction of the first wire, that starts from the first end of the first wire and ends with the intersection of the Y line segment.

The first Manhattan direction includes either a horizontal or vertical direction, and the second Manhattan direction includes either a horizontal or vertical direction, opposite from the first Manhattan direction. In one embodiment, the Manhattan directional wires are configured to simulate a 45 degree wiring direction, and, in another embodiment, the Manhattan directional wires are configured to simulate a 60 degree wiring direction. The pairs of conductors may be configured, essentially in parallel, to generate tracks of conductor on a metal layer in the simulated direction.

BRIEF DESCRIPTION OF DRAWINGS

FIG. 5b is a block diagram illustrating one embodiment for combining additional diagonal wiring layers to the configuration of FIG. 5a.

DETAILED DESCRIPTION

Figure 1A:
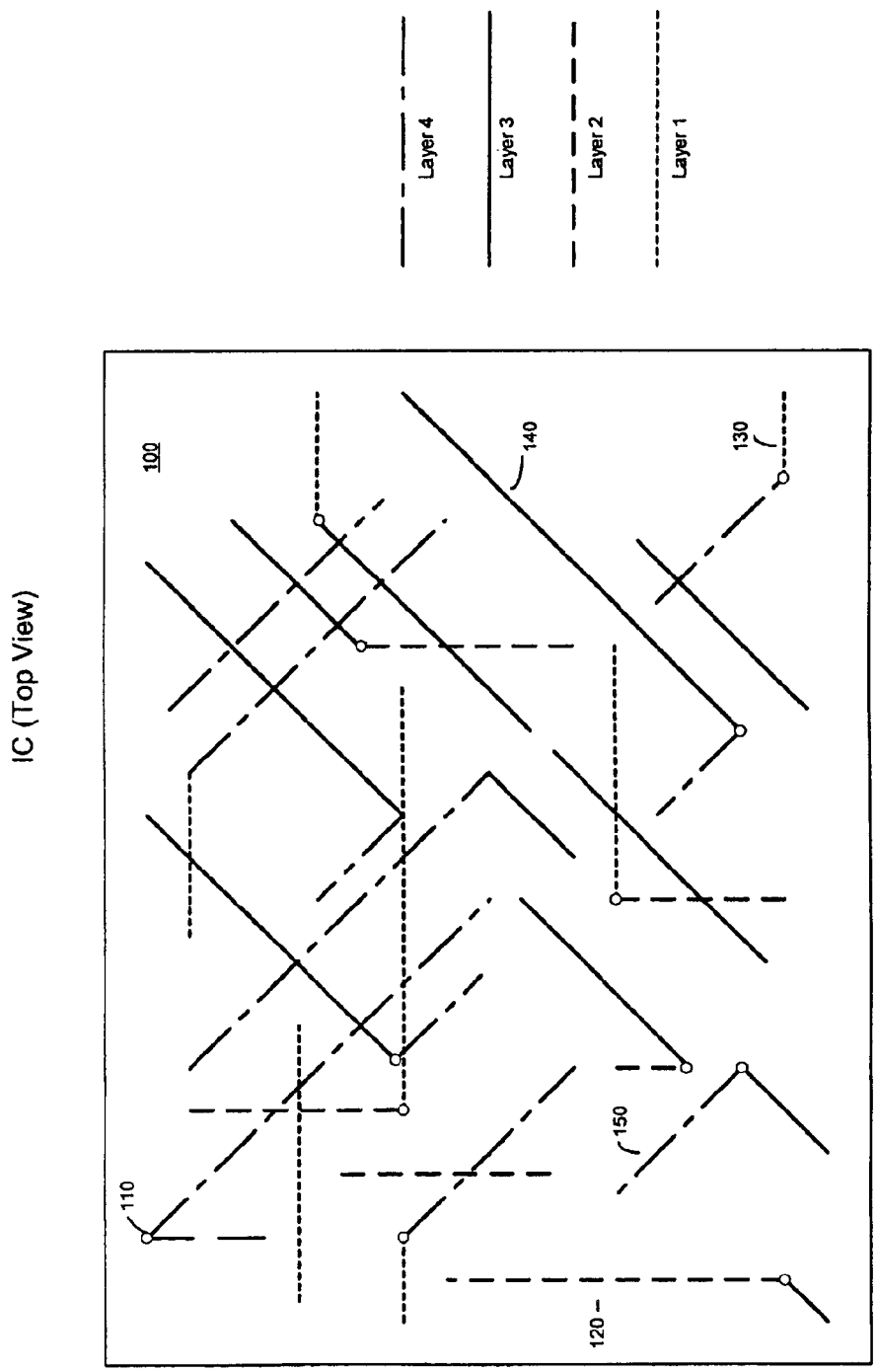
FIG. 1a illustrates an example multiple metal layered integrated circuit that employs diagonal wiring.

The present invention utilizes diagonal wiring in a "preferred" direction. For purposes of nomenclature, a "preferred" direction is defined as the direction that at least 40 percent of the wires are configured. For example, the preferred direction may be Manhattan (i.e., horizontal or vertical) or diagonal. As used herein, diagonal wiring is defined as metal conductors configured at various Euclidean angles. interconnect lines are considered "diagonal" if they form an angle other than zero or ninety degrees with respect to the layout boundary of the IC. In preferred embodiments, diagonal wiring consists of wires deposed at plus 45 degrees or minus 45 degrees (referred to herein as "octalinear"). This wiring architecture is referred to as octagonal wiring in order to convey that an interconnect line can traverse in eight separate directions from any given point. Wires deposed at any combination of 60 degrees and 30 degrees are referred to herein as "hexalinear." For purposes of simplicity, hexalinear wiring is illustrated as plus 60 or minus 60; however, any combination of 30 degrees and 60 degrees may be used. Although the use of the diagonal wiring in the present invention is described in conjunction with wires arranged at plus 45, minus 45, as well as combinations of 30 degrees and 60 degrees, any angle offset from zero and 90 degrees (horizontal or vertical) may be used as diagonal wiring without deviating from the spirit or scope of the invention.

In general, metal layers on integrated circuit are typically organized in perpendicular metal layer pairs. The use of perpendicular metal layer pairs minimizes wiring distances by minimizing the number of layers a wire or via must traverse to get to a layer with wires disposed in an opposite direction (e.g., vertical to horizontal). In addition, the use of perpendicular wiring, which eliminates wires routed in parallel, reduces electrical coupling between metal layers and minimizes noise interference.

Some embodiments of the present invention are described using "complementary" pairs. As used herein, complementary pairs refer to two wiring layers with a preferred wiring direction perpendicular to one another. For example, a complement to a vertical wiring layer is a horizontal wiring layer. In diagonal wiring, a complementary direction to a plus 45 degree wiring direction is a minus 45 degree wiring direction. Similarly, a complementary direction to a minus 60 degree wiring direction is a plus 30 degree wiring direction, a complementary direction to a minus 30 degree wiring direction is a plus 60 degree wiring direction, and a complementary direction to a plus 60 degree wiring direction is a minus 60 degree wiring direction, etc.

FIG. 1a illustrates multiple metal layers that employ diagonal wiring. In this architecture, the IC layout utilizes horizontal, vertical, and 45° diagonal interconnect lines. The horizontal lines are the lines that are parallel to the x-axis (i.e., the horizontal lines are at 0° to the x-axis and parallel to the length of the layout). The vertical lines are the lines that are perpendicular to the x-axis (i.e., the vertical lines are at 90° to the x-axis). In this architecture, one set of diagonal lines (layer 3) are at +45° with respect to the length of the IC layout, while another set (layer 4) are at −45° with respect to the length of the IC layout.

A top view of integrated circuit 100 is shown in FIG. 1a. For this example, there are four metal or wire layers. As shown in FIG. 1a, wires deposed in layer one are designated with short dashed lines, wires deposed in layer two are designated with longer dashed lines, wires deposed in layer 3 are designated with a solid line, and wires deposed in layer four are designated with alternating long-short dashed lines. The wires in a layer do not touch or cross other wires in that layer. As shown in FIG. 1a, layer "1"wires, such as wire 130, have a predominate or "preferred"horizontal direction. The wires deposed in layer "1" are situated horizontally such that the wires run parallel to the top and bottom of integrated circuit 100. The wires deposed in layer "2"have a preferred vertical direction (e.g., wire 120 is situated in a vertical direction relative to the top and bottom of the integrated circuit chip 100). Thus, for this example, metal layers one and two are Manhattan layers with horizontal and vertical preferred directions, respectively.

For the example of FIG. 1a, layers "3"and "4"employ diagonal wiring. Specifically, layer "3" has a preferred diagonal direction (i.e., plus 45 degrees) relative to the top and bottom of integrated circuit 100. Wire 140 is an example layer "3"wire oriented in a diagonal direction. Layer "4"has a preferred diagonal direction that is minus 45 degrees relative to the top and bottom of integrated circuit 100. Wire 150 is example of a layer "4" wire situated at minus 45 degrees.

The example of FIG. 1a also includes a plurality of vias. In general, the vias provide an electrical conductor between metal layers to permit routing between the metal layers in the integrated circuit. The circles illustrated in FIG. 1a depict vias connecting wires on different layers. For example, via 110 electrically connects a vertical wire on layer "2"to a diagonal wire on layer "4." Similarly, several vias are shown in the example of FIG. 1a to couple wires: between Manhattan layers, between diagonal layers, and between Manhattan and diagonal layers. The use of diagonal wiring more efficiently routes wires in the integrated circuit by reducing the length of the wire.

Figure 1B:
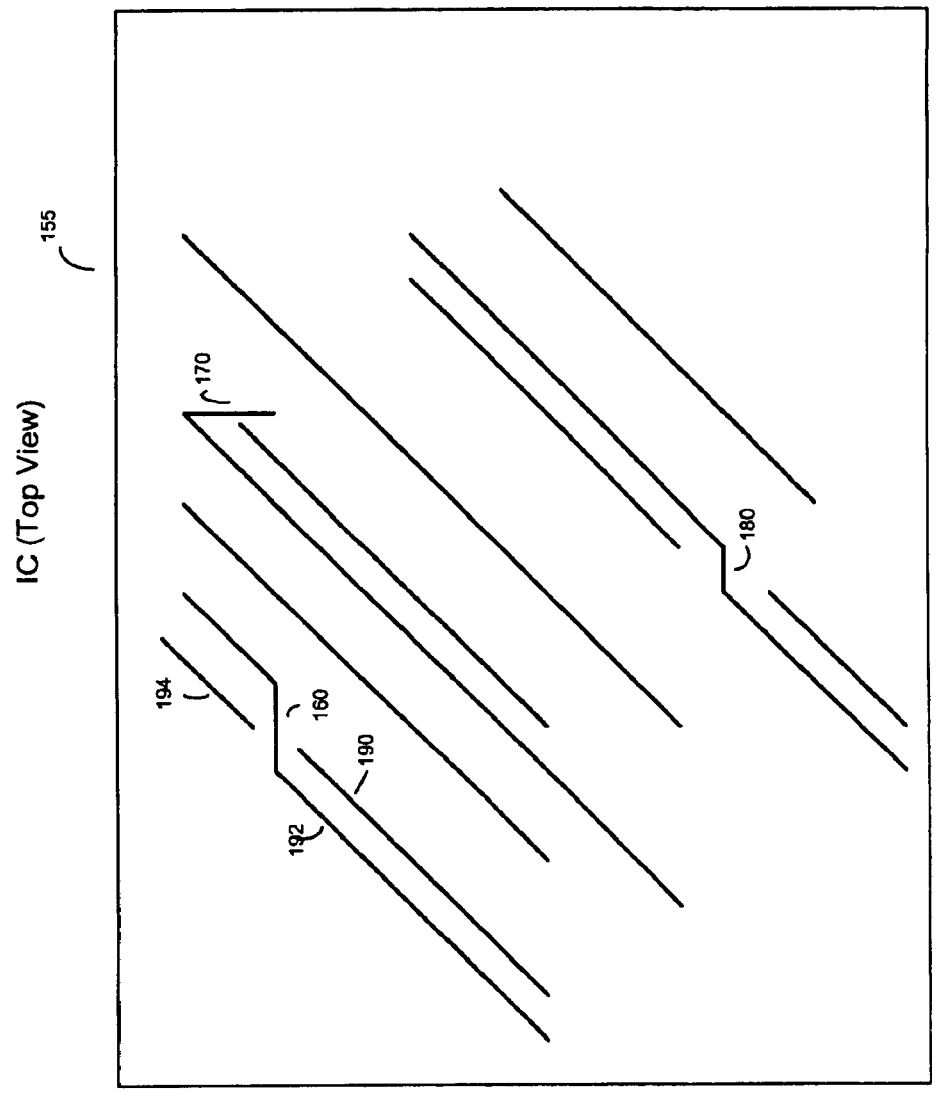
FIG. 1b illustrates another example of an integrated circuit that employs diagonal wiring.

FIG. 1b illustrates another example of an integrated circuit that employs diagonal wiring. The top view of integrated circuit 155 shows a single metal or wire layer. For this example, the preferred direction for the metal layer is plus 45 degrees. As the diagonal direction is a "preferred": direction, wires oriented in directions other than a diagonal direction are also permitted. Specifically, integrated circuit 155 includes wire 160, oriented in a horizontal direction, to couple or connect two diagonal wires situated on different diagonal "tracks." Similarly, horizontal wire 180 couples two diagonal wires in two different tracks. Also, for this example, in addition to horizontal wires In a metal layer with a preferred diagonal direction, a vertical wire 170 is disposed.

The diagonal wiring of the present invention may be implemented on a gridless system. Typically, wires are placed on a grid to define spacing between potential "tracks" for placement of wires on that layer. For example, a grid may define spacing between rows of tracks in a metal layer that has a preferred horizontal direction. Thus, grids are used to define minimum spacing between wires or "tracks" on a metal layer in the preferred direction. For the example of FIG. 1b, wires are not evenly spaced on a grid (i.e., the wires are not aligned on a grid). Although the spacing between wires maintains the minimum spacing specified by design rules, the spacing is not necessarily uniform across the metal layer in a gridless system. For example, the spacing between wires 190 and 192 is greater than the diagonal spacing between wires 192 and 194. This wire placement illustrates the orientation of diagonal wires on a gridless system.

In one embodiment, the use of a horizontal or vertical wire in a layer with a preferred diagonal direction is defined as a "zag." The use of a zag minimizes obstruction of adjacent "tracks" by not creating an obstruction in one track to detour a wire to another track. Thus, the use of zags minimizes the number of vias required.

Figure 2A:
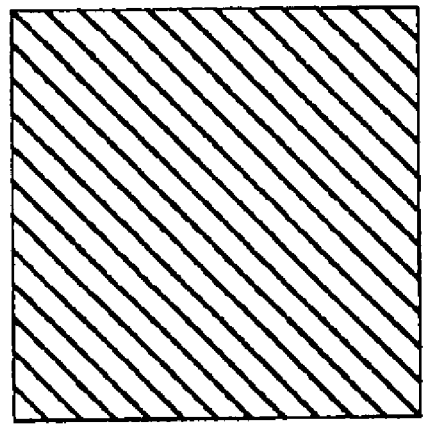
FIG. 2a illustrates one embodiment for a complementary octalinear pair.
Figure 2A:
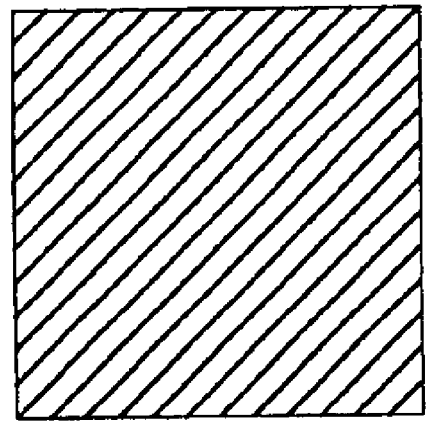

FIG. 2a illustrates one embodiment for a complementary octalinear pair. For this embodiment, layer "n"has a preferred direction of plus 45 degrees as illustrated by a plurality of "tracks" drawn across the area of the metal layer. As a complement to layer "n", layer "n+1"consists of a preferred direction of minus 45 degrees. The preferred direction of minus 45 degrees is also illustrated by a plurality of tracks drawn at minus 45 degrees on layer "n+1"in FIG. 2a.

Figure 2B:
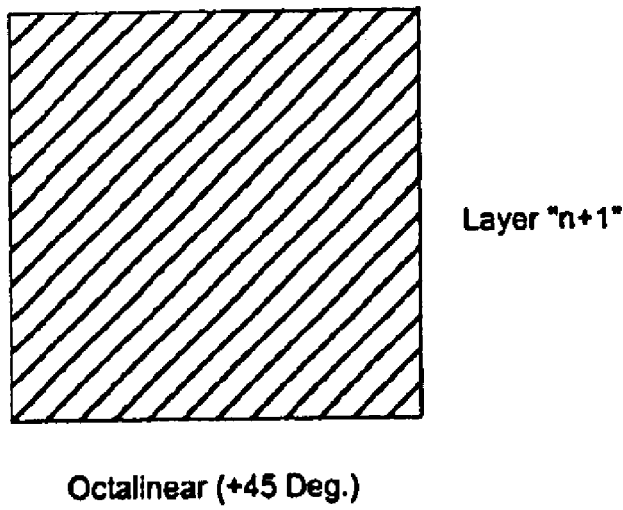
FIG. 2b illustrates another embodiment for a complementary octalinear metal layer pair.
Figure 2B:
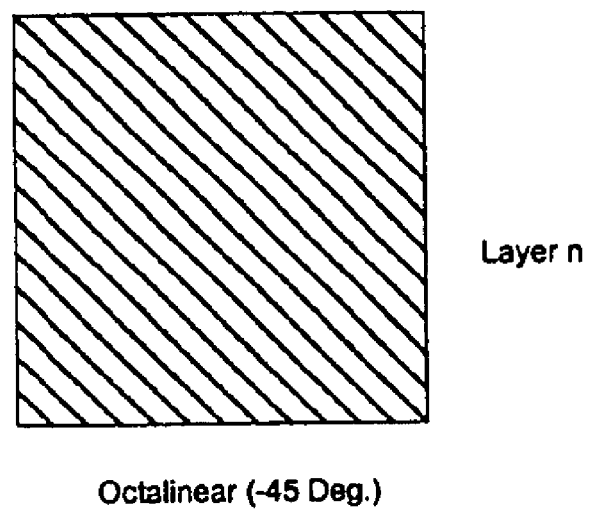

FIG. 2b illustrates another embodiment for a complementary octalinear metal layer pair. For this embodiment, layer "n"has a preferred direction of minus 45 degrees. The complementary layer, layer "n+1", has a preferred direction of plus 45 degrees. Again, the preferred direction is illustrated by a plurality of track lines drawn in the preferred direction.

Figure 3A:
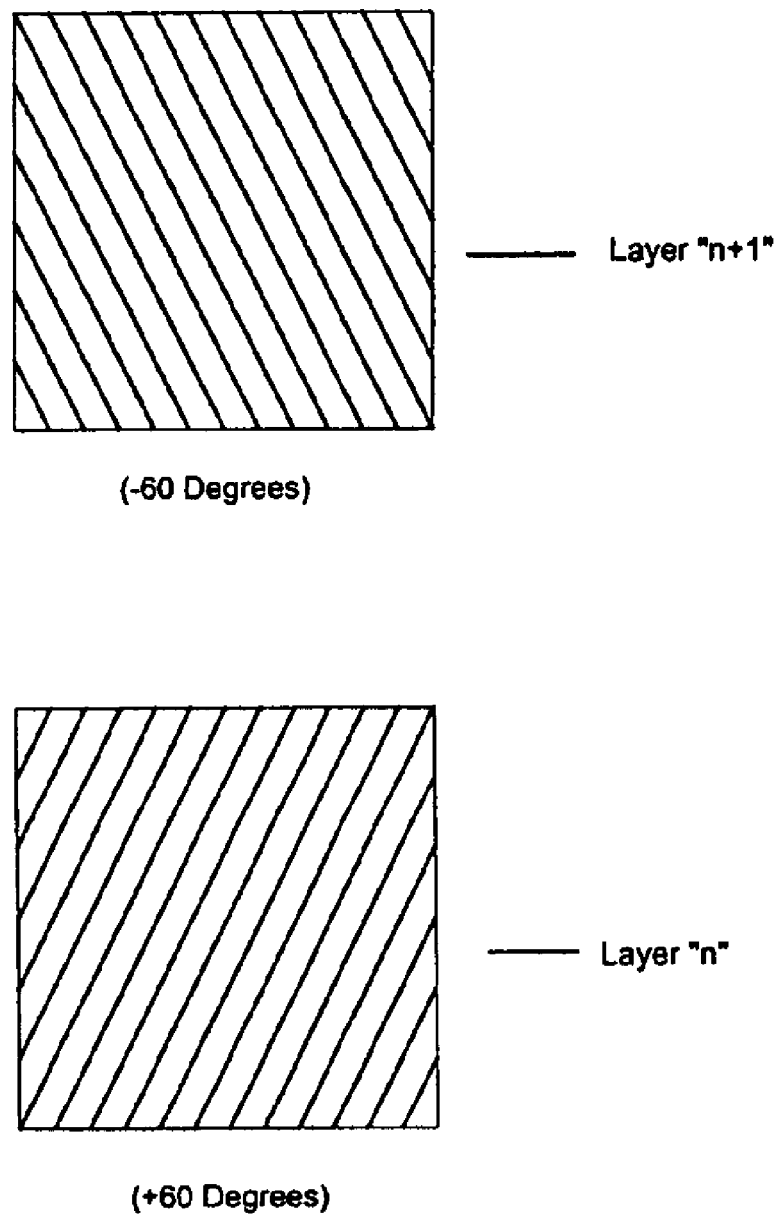
FIG. 3a illustrates another example of complementary diagonal pair layers.
Figure 3B:
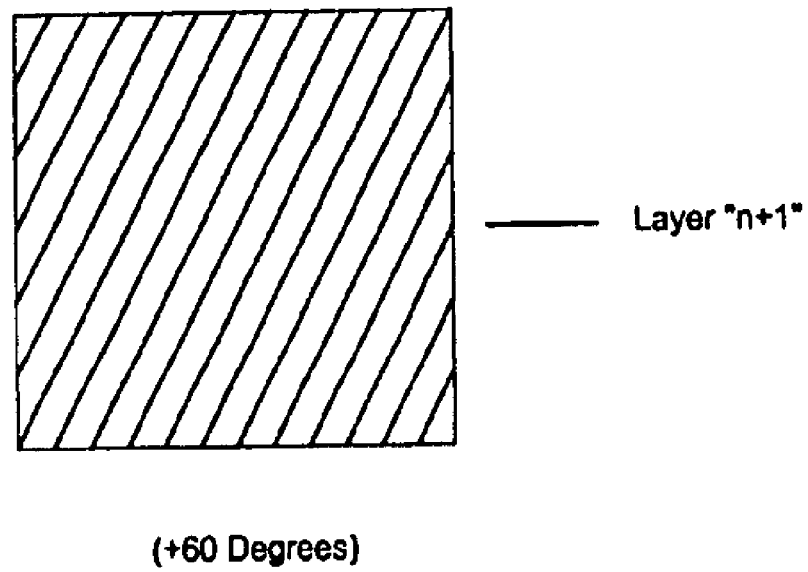
FIG. 3b illustrates another complementary pair, wherein diagonal wiring is the preferred direction.
Figure 3B:
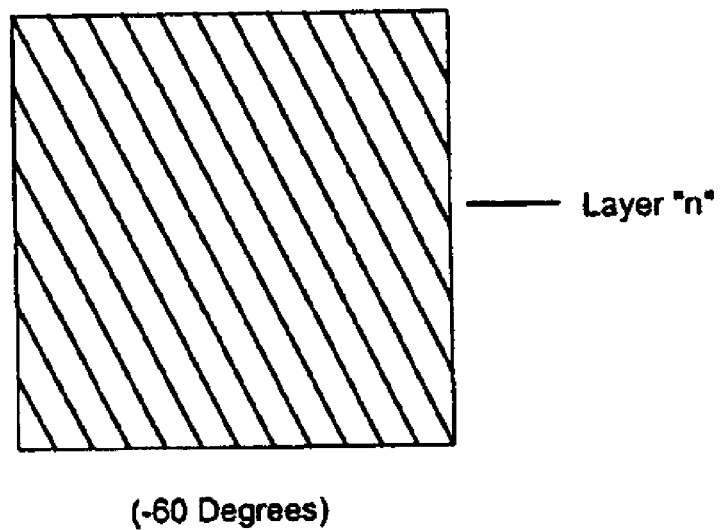

FIG. 3a illustrates another example of complementary diagonal pair layers. The complementary diagonal pairs of FIGS. 2a and 2b are situated at plus/minus 45 degrees, whereas the complementary diagonal pairs of FIGS. 3a and 3b are arranged in plus/minus 60 degree pairs. The embodiment of FIG. 3a illustrates layer "n" with a preferred direction of plus 60 degrees, and illustrates complementary layer "n+1" with a preferred direction of minus 60 degrees. The embodiment of FIG. 3b illustrates another complementary pair, wherein diagonal wiring is the preferred direction. For this embodiment, the complementary pairs are situated such that layer "n" has a preferred direction of minus 60 degrees, and layer "n+1" has a preferred direction of plus 60 degrees.

Figure 4A:
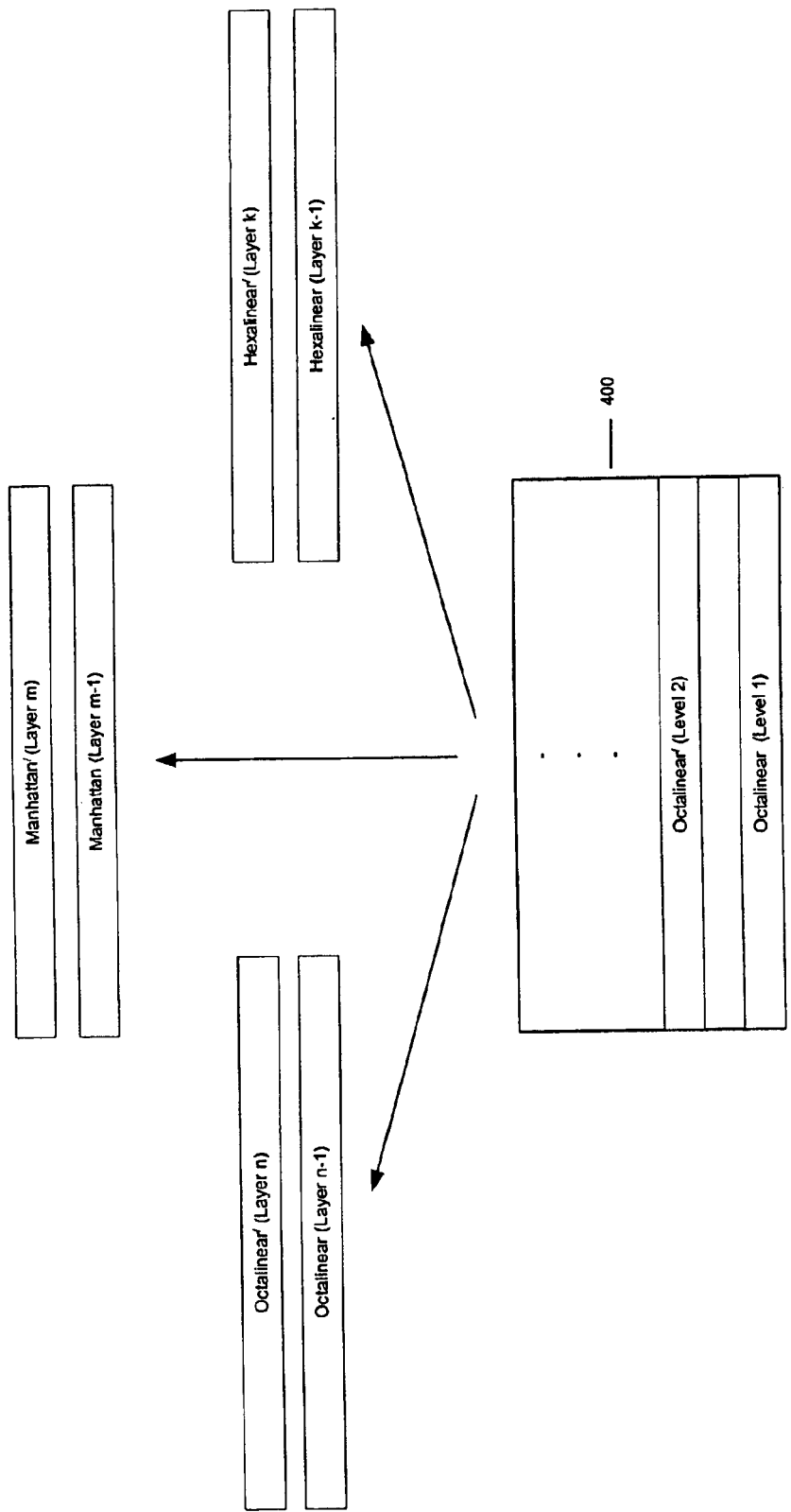
FIG. 4a illustrates an integrated circuit implemented using octalinear wiring geometries for metal layers 1 and 2.
Figure 4B:
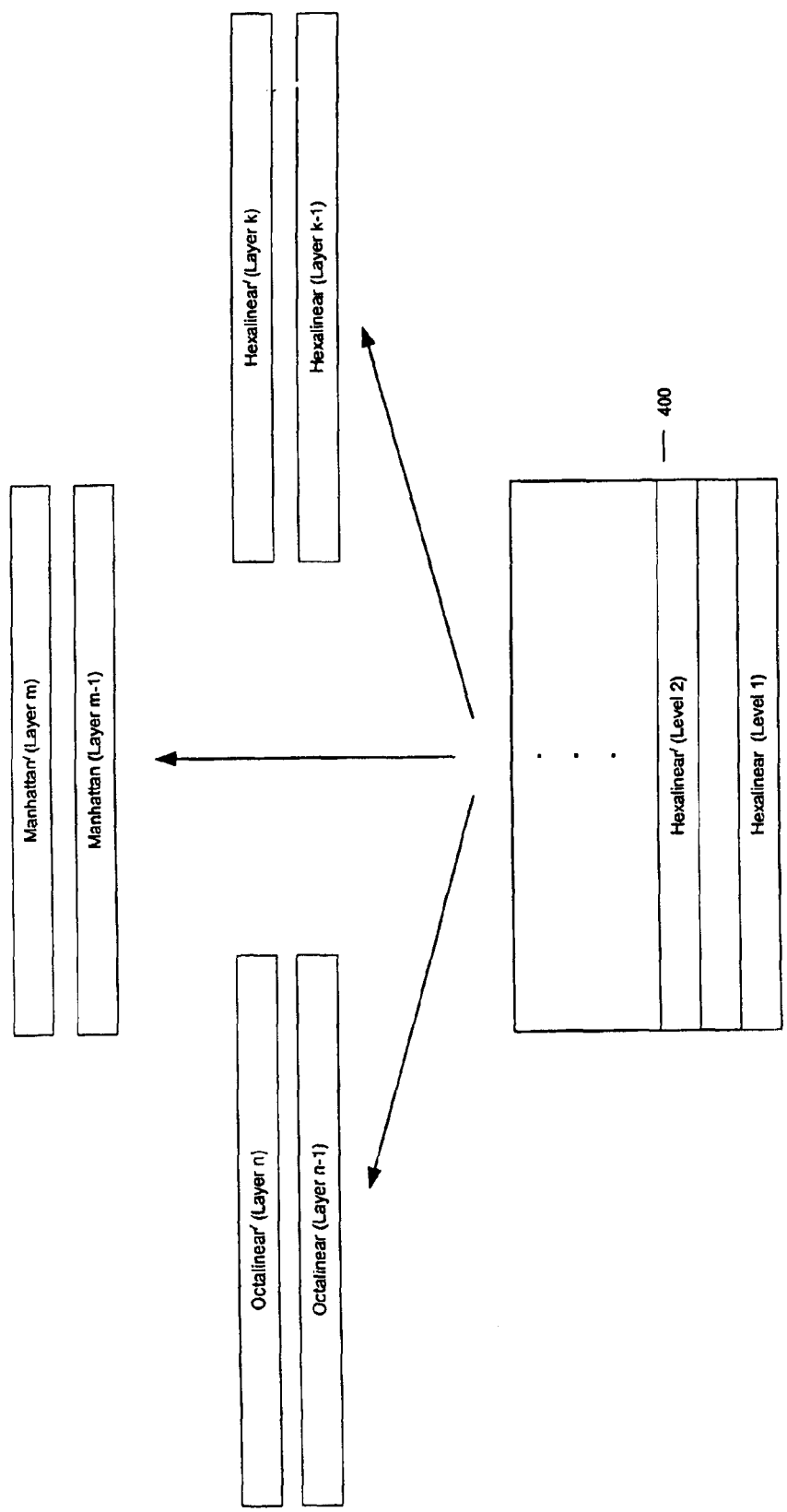
FIG. 4b illustrates an integrated circuit implemented using hexalinear wiring geometries for metal layers 1 and 2.

FIGS. 4a–b illustrate multi-layer wiring configurations. Specifically, FIG. 4a illustrates an integrated circuit implemented using octalinear wiring geometries for metal layers 1 and 2. For this embodiment, level "1" has a preferred octalinear direction, and level "2" has a preferred octalinear direction complementary to the octalinear direction of level "1".

A side view of integrated circuit 400 reveals various configurations of metal layers (i.e., "n", "m", and "k"layers). The variables "n", "m"and "k" may include any integer value greater than 2. In one embodiment, in addition to the octalinear wiring geometries for metal layers 1 and 2, the integrated circuit includes complementary octalinear layer pairs for layers "n"and "n−1." For example the preferred direction of level "n"may be plus 45 degrees and the preferred direction of level "n-1" may be minus 45 degrees, or the preferred direction of level "n" may be minus 45 degrees, and the preferred direction of level "n-1" may be plus 45 degrees. In one embodiment, if n is equal to 4, then layers "3" and "4" also have preferred octalinear directions situated as a complementary pair (i.e., the preferred direction of level "3" is complementary to the preferred direction of level "4"). Additional embodiments for single octalinear layer geometries may also be employed. For example, layer 3 may employ an octalinear wiring geometry without a complementary octalinear wiring layer.

FIG. 4*a* also illustrates embodiments that include one or more layers of Manhattan wiring geometries. For these embodiments, complementary Manhattan layer pairs for layers "m" and "m-1" are deposed on top of metal layers 1 and 2. The preferred direction of level "m" may be 90 degrees and the preferred direction of level "m-1" may be 0 degrees, or the preferred direction of level "m" may be 0 degrees and the preferred direction of level "m-1" may be 90 degrees. For example, if m is equal to 4, then layers "3" and "4" have preferred Manhattan direction layers situated as a complementary pair. Embodiments that employ single Manhattan layer geometries are also shown. For example, layer 3 may employ a Manhattan wiring geometry without a complementary Manhattan wiring layer.

FIG. 4*a* also illustrates embodiments that include one or more layers of hexalinear wiring geometries. For these embodiments, complementary hexalinear layer pairs for layers "k" and "k-1" are deposed on top of metal layers 1 and 2. The preferred direction of level "k" may be plus 60 degrees and the preferred direction of level "k-1" may be minus 60 degrees, or the preferred direction of level "k" may be minus 60 degrees and the preferred direction of level "k-1" may be plus 60 degrees. For example, if m is equal to 4, then layers "3" and "4" have preferred hexalinear direction layers situated as a complementary pair. Embodiments that employ single hexalinear layer geometries are also shown. For example, layer 3 may employ a hexalinear wiring geometry without a complementary hexalinear wiring layer.

FIG. 4*b* illustrates an integrated circuit implemented using hexalinear wiring geometries for metal layers 1 and 2. For this embodiment, level "1" has a preferred hexalinear direction, and level "2" has a preferred hexalinear direction complementary to the hexalinear direction of level "1:". A side view of the integrated circuit shown in 4*b* reveals various configurations of metal layers (i.e., "n", "m", and "k" layers). The variables "n", "m" and "k" may include any integer value greater than 2. In one embodiment, in addition to the hexalinear wiring geometries for metal layers 1 and 2, the integrated circuit includes complementary octalinear layer pairs for layers "n" and "n-1." For example, the preferred direction of level "n" may be plus 45 degrees and the preferred direction of level "n-1" may be minus 45 degrees, or the preferred direction of level "n" may be minus 45 degrees, and the preferred direction of level "n-1" may be plus 45 degrees. In one embodiment, if n is equal to 4, then layers "3" and "4" have preferred octalinear directions situated as a complementary pair. Additional embodiments for single octalinear layer geometries may also be employed. For example, layer 3 may employ an octalinear wiring geometry without a complementary octalinear wiring layer.

FIG. 4*b* also illustrates embodiments that include one or more layers of Manhattan wiring geometries. For these embodiments, complementary Manhattan layer pairs for layers "m" and "m-1" are deposed on top of metal layers 1 and 2. The preferred direction of level "m" may be 90 degrees and the preferred direction of level "m-1" may be 0 degrees, or the preferred direction of level "m" may be 0 degrees and the preferred direction of level "m-1" may be 90 degrees. For example, if m is equal to 4, then layers "3" and "4" have preferred Manhattan direction layers situated as a complementary pair. Embodiments that employ single Manhattan layer geometries are also shown. For example, layer 3 may employ a Manhattan wiring geometry without a complementary Manhattan wiring layer.

FIG. 4*b* also illustrates embodiments that include one or more layers of hexalinear wiring geometries. For these embodiments, complementary hexalinear layer pairs for layers "k" and "k-1" are deposed on top of metal layers 1 and 2. The preferred direction of level "k" may be plus 60 degrees and the preferred direction of level "k-1" may be minus 60 degrees, or the preferred direction of level "k" may be minus 60 degrees and the preferred direction of level "k-1" may be plus 60 degrees. For example, if m is equal to 4, then layers "3" and "4" have preferred hexalinear direction layers situated as a complementary pair. Embodiments that employ single hexalinear layer geometries are also shown. For example, layer 3 may employ a hexalinear wiring geometry without a complementary hexalinear wiring layer.

Figure 5A:
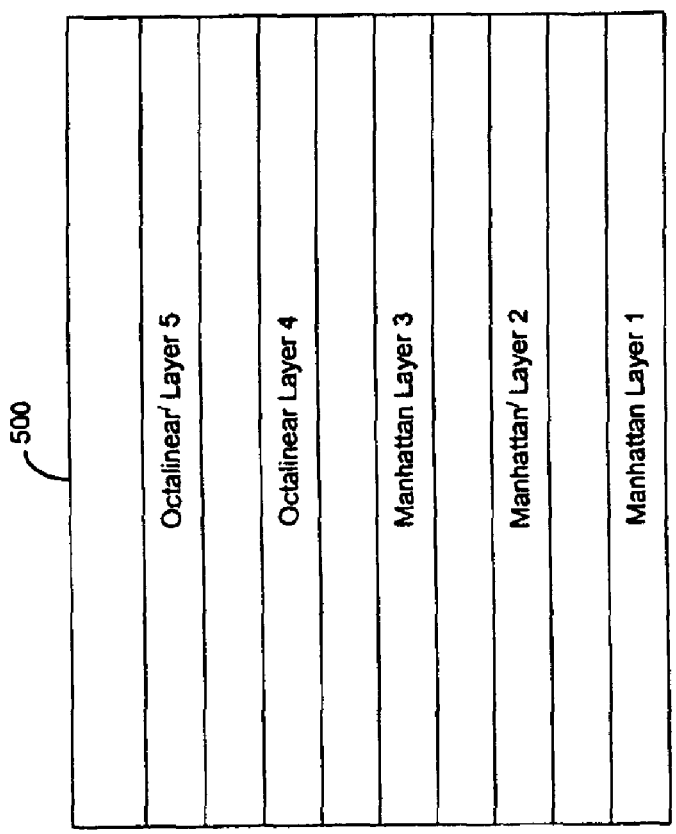
FIG. 5a is a block diagram illustrating one embodiment for combining one or more diagonal wiring layers with legacy Manhattan layers.

FIG. 5*a* is a block diagram ilustrating one embodiment for combining one or more diagonal wiring layers with legacy Manhattan layers. Existing integrated circuit technology uses Manhattan (i.e., vertical and horizontal) wiring geometries. Typically, integrated circuit sub blocks licensed for use by third parties incorporate levels one through three using Manhattan wiring schemes. Thus, layers "1" through "3" that employ Manhattan wiring schemes are referred to herein as legacy Manhattan geometries.

Figure 5B:
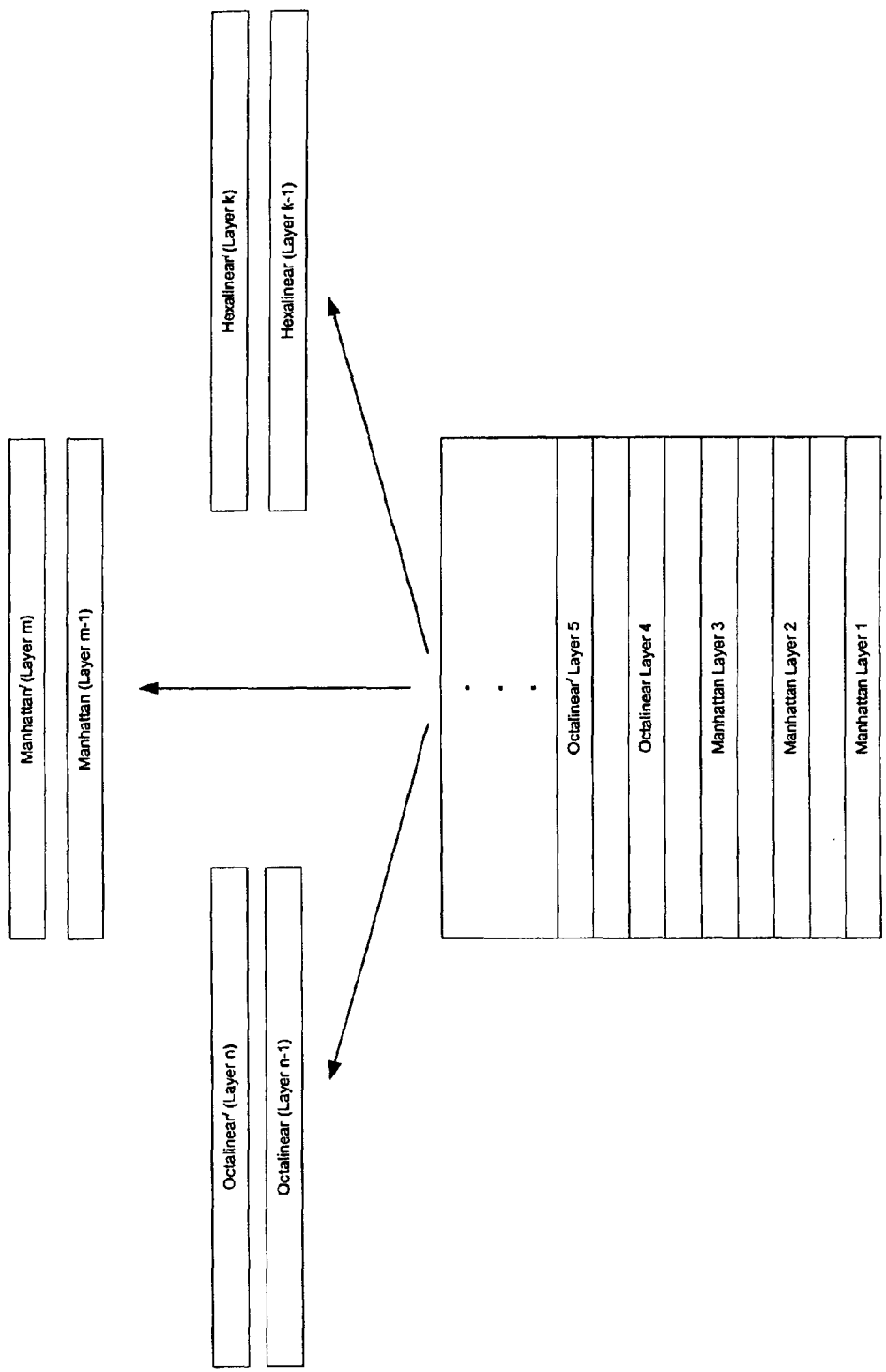

In FIG. 5*a*, an integrated circuit 500 is shown as having "5" metal layers. Layers "1" "3" are configured with Manhattan wiring schemes. Specifically, Manhattan layer "2" is complementary to Manhattan layer "1", and Manhattan layer "3" is complementary to Manhattan layer "2". Layers "4" and "5" have, as a preferred wiring direction, diagonal wiring schemes. In one embodiment, the diagonal wiring direction comprises an octalinear wiring direction. Diagonal layer 5 is complementary to the direction of diagonal layer "4." FIG. 5*b* is a block diagram illustrating one embodiment for combining additional diagonal wiring layers to the configuration of FIG. 5*a*. In FIG. 5*b*, an integrated circuit is shown as having "n", "m" or "k" metal layers. Thus, any number of additional diagonal metal layers may be added on in addition to layer "5", as needed to fulfill routing requirements. The variables "n", "m" and "k" may include any integer value greater than 6. FIG. 5b also shows, for wiring geometries in levels 1–3, Manhattan wiring geometry that may or may not be oriented in complementary or perpendicular pairs.

In one embodiment shown in FIG. 5b, in addition to the Manhattan and octalinear wiring geometries for metal layers 1–5, the integrated circuit includes complementary octalinear layer pairs for layers "n" and "n–1." For example, the preferred direction of level "n" may be plus 45 degrees and the preferred direction of level "n–1" may be minus 45 degrees, or the preferred direction of level "n" may be minus 45 degrees, and the preferred direction of level "n–1" may be plus 45 degrees. In one embodiment, if n is equal to 7, then layers "7" and "6" have preferred octalinear directions, situated as a complementary pair (i.e., the preferred direction of level "6" is complementary to the preferred direction of level "7"). Additional embodiments for single octalinear layer geometries may also be employed. For example, layer 6 may employ an octalinear wiring geometry without a complementary octalinear wiring layer.

FIG. 5b also illustrates embodiments that include one or more layers of Manhattan wiring geometries. For these embodiments, complementary Manhattan layer pairs for layers "m" and "m–1" are deposed on top of metal layers 1–5. The preferred direction of level "m" may be 90 degrees and the preferred direction of level "m–1" may be 0 degrees, or the preferred direction of level "m" may be 0 degrees and the preferred direction of level "m–1" may be 90 degrees. For example, if m is equal to 7, then layers "6" and "7" have preferred Manhattan direction layers situated as a complementary pair. Embodiments that employ single Manhattan layer geometries are also shown. For example, layer 6 may employ a Manhattan wiring geometry without a complementary Manhattan wiring layer.

FIG. 5b also illustrates embodiments that include one or more layers of hexalinear wiring geometries. For these embodiments, complementary hexalinear layer pairs for layers "k" and "k–1" are deposed on top of metal layers 1–5. The preferred direction of level "k" may be plus 60 degrees and the preferred direction of level "k–1" may be minus 60 degrees, or the preferred direction of level "k" may be plus 60 degrees and the preferred direction of level "k–1" may be minus 60 degrees. For example, if k is equal to 7, then layers "6" and "7" have preferred hexalinear direction layers situated as a complementary pair. Embodiments that employ single hexalinear layer geometries are also shown. For example, layer 6 may employ a hexalinear wiring geometry without a complementary hexalinear wiring layer.

Figure 6A:
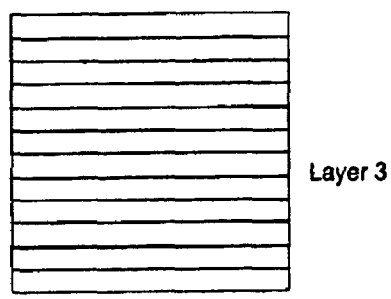
FIG. 6a illustrates one embodiment for a legacy Manhattan metal layer configuration.
Figure 6A:
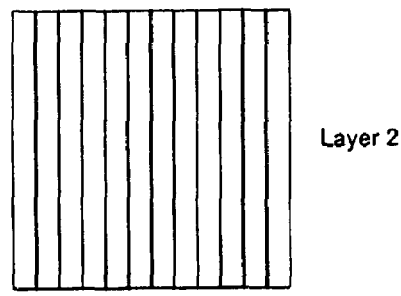
Figure 6A:
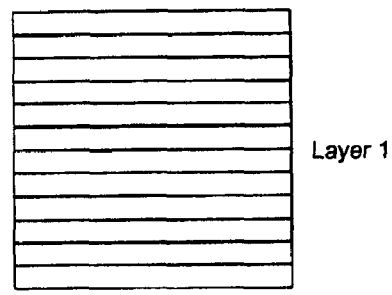
Figure 6B:
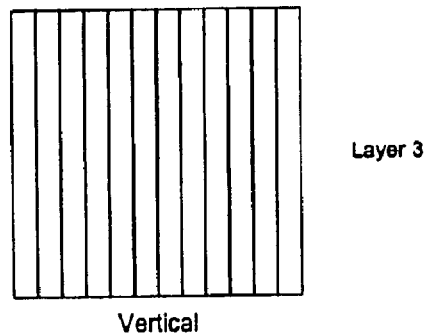
FIG. 6b illustrates a second legacy Manhattan wiring geometry.
Figure 6B:
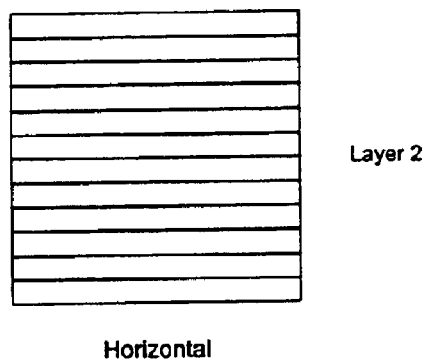
Figure 6B:
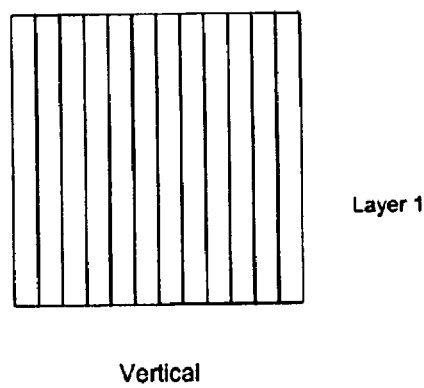

FIG. 6a illustrates one embodiment for a legacy Manhattan metal layer configuration. For this embodiment, layer "1" has a preferred horizontal direction, layer "2" has a preferred vertical direction, and layer "3" has a preferred horizontal direction. As such, the preferred direction of layer "2" is complementary to the preferred direction of layer "1". Similarly, the preferred direction of layer "3" is complementary to the preferred direction of layer "2." FIG. 6b illustrates a second legacy Manhattan wiring geometry. For this embodiment, the first layer has a preferred vertical direction as shown by the vertical lines in FIG. 6b. Layer "2", complementary to layer "1", has a preferred horizontal direction. Layers "3", complementary to layer "2", has a preferred vertical direction.

Figure 6C:
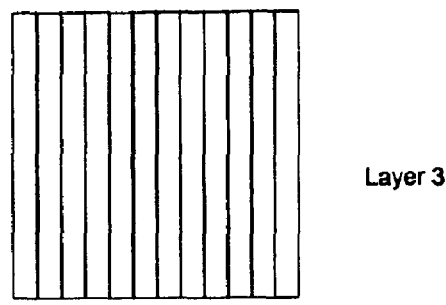
FIG. 6c illustrates a third legacy Manhattan wiring geometry.
Figure 6C:
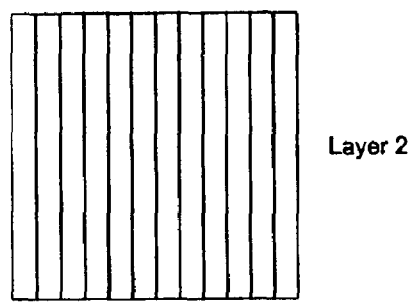
Figure 6C:
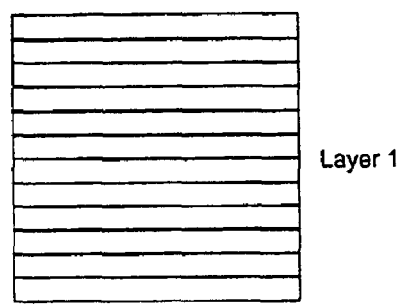

FIG. 6c illustrates a third legacy Manhattan wiring geometry. For this embodiment, the first layer has a preferred horizontal direction as shown by the horizontal "track" lines in FIG. 6c. Layer "2", complementary to layer "1", has a preferred vertical direction. Layers "3" has a preferred vertical direction, similar to layer 2.

Figure 6D:
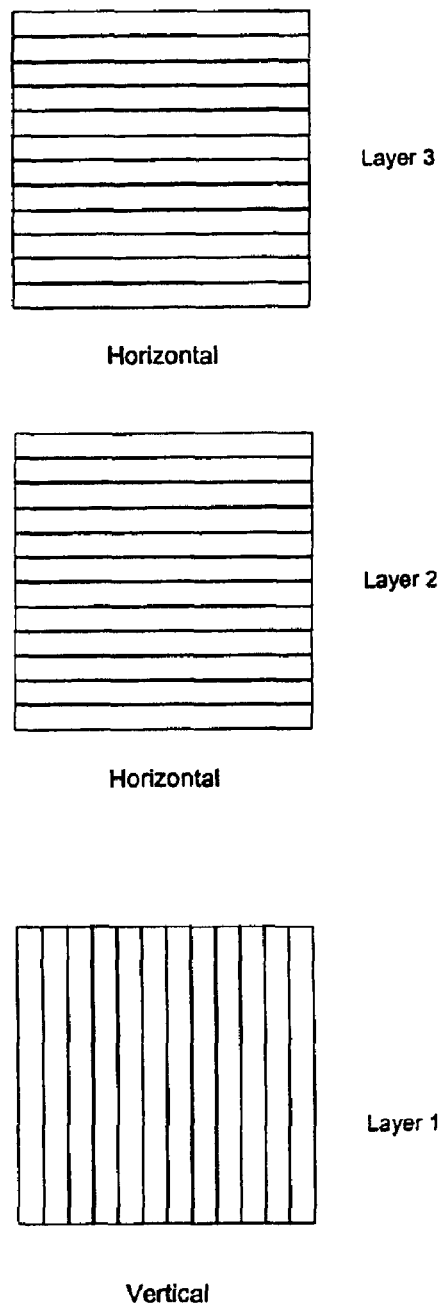
FIG. 6d illustrates a fourth legacy Manhattan wiring geometry.

FIG. 6d illustrates a fourth legacy Manhattan wiring geometry. For this embodiment, the first layer has a preferred vertical direction as shown by the vertical "track" lines In FIG. 6d. Layer "2", complementary to layer "l", has a preferred horizontal direction. Layers "3" has a preferred horizontal direction, similar to layer 2.

Figure 7:
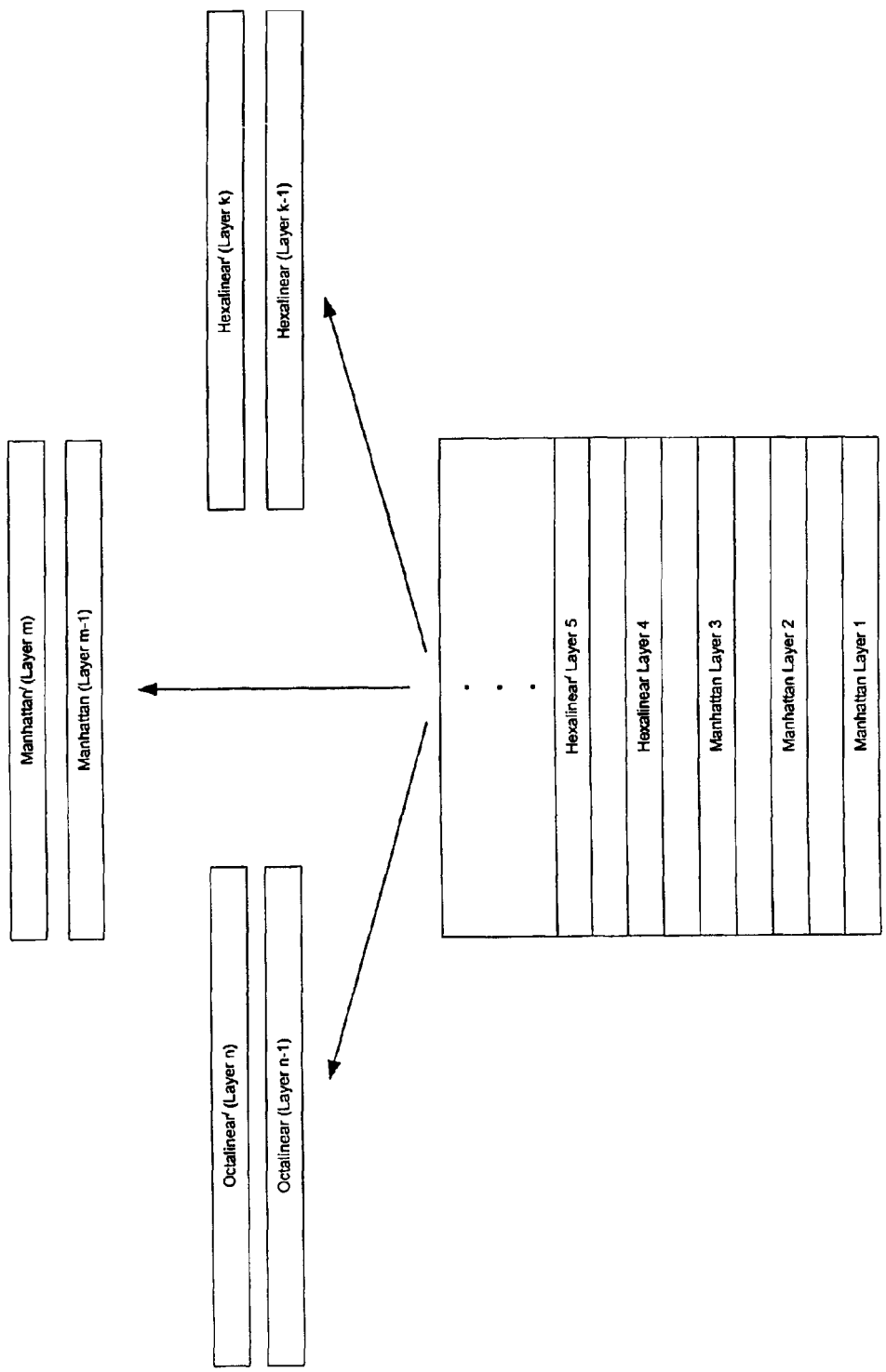
FIG. 7 illustrates one embodiment for combining hexalinear wiring layers with legacy Manhattan layers.

FIG. 7 illustrates one embodiment for combining hexalinear wiring layers with legacy Manhattan layers. A shown in FIG. 7, metal layers "1", "2" and "3" have preferred Manhattan wiring directions. In some embodiments, the preferred direction of layer "2" Is complementary to the preferred direction of layers "1" and "3" to form a geometry of horizontal-vertical-horizontal or vertical-horizontal-vertical. For the embodiment of FIG. 7, metal layers "4" and "5" are configured as hexalinear complementary pairs for the preferred wiring direction. In one embodiment, layer "4" has a preferred direction of plus 60 degrees and layer "5" has a preferred direction of minus 60 degrees. In another embodiment, layer "4" has a preferred direction of minus 60 degrees, and layer "5" has a preferred direction of plus 60 degrees.

The integrated circuit of FIG. 7 is shown as having "n", "m" or "k" metal layers. Thus, any number of additional diagonal metal layers may be added on in addition to layer "5", as needed to fulfill routing requirements. The variables "n", "m" and "k" may include any integer value greater than 6.

In one embodiment shown in FIG. 7, in addition to the Manhattan and hexalinear wiring geometries for metal layers 1–5, the integrated circuit includes complementary octalinear layer pairs for layers "n" and "n–1." For example, the preferred direction of level "n" may be plus 45 degrees and the preferred direction of level "n–1" may be minus 45 degrees, or the preferred direction of level "n" may be minus 45 degrees, and the preferred direction of level "n–1" may be plus 45 degrees. In one embodiment, if n is equal to 7, then layers "7" and "6" have preferred octalinear directions, situated as a complementary pair (i.e., the preferred direction of level "6" is complementary to the preferred direction of level "7"). Additional embodiments for single octalinear layer geometries may also be employed. For example, layer 6 may employ an octalinear wiring geometry without a complementary octalinear wiring layer.

FIG. 7 also illustrates embodiments that include one or more layers of Manhattan wiring geometries. For these embodiments, complementary Manhattan layer pairs for layers "m" and "m–1" are deposed on top of metal layers 1–5. The preferred direction of level "m" may be 90 degrees and the preferred direction of level "m–1" may be 0 degrees, or the preferred direction of level "m" may be 0 degrees and the preferred direction of level "m–1" may be 90 degrees. For example, if m is equal to 7, then layers "6" and "7" have preferred Manhattan direction layers situated as a complementary pair. Embodiments that employ single Manhattan layer geometries are also shown. For example, layer 6 may employ a Manhattan wiring geometry without a complementary Manhattan wiring layer.

FIG. 7 also illustrates embodiments that include one or more layers of hexalinear wiring geometries. For these embodiments, complementary hexalinear layer pairs for layers "k" and "k–1" are deposed on top of metal layers 1–5. The preferred direction of level "k" may be plus 60 degrees and the preferred direction of level "k–1" may be minus 60 degrees, or the preferred direction of level "k" may be plus 60 degrees and the preferred direction of level "k–1" may be minus 60 degrees. For example, if k is equal to 7, then layers "6" and "7" have preferred hexalinear direction layers situated as a complementary pair. Embodiments that employ single hexalinear layer geometries are also shown. For example, layer 6 may employ a hexalinear wiring geometry without a complementary hexalinear wiring layer.

Figure 8:
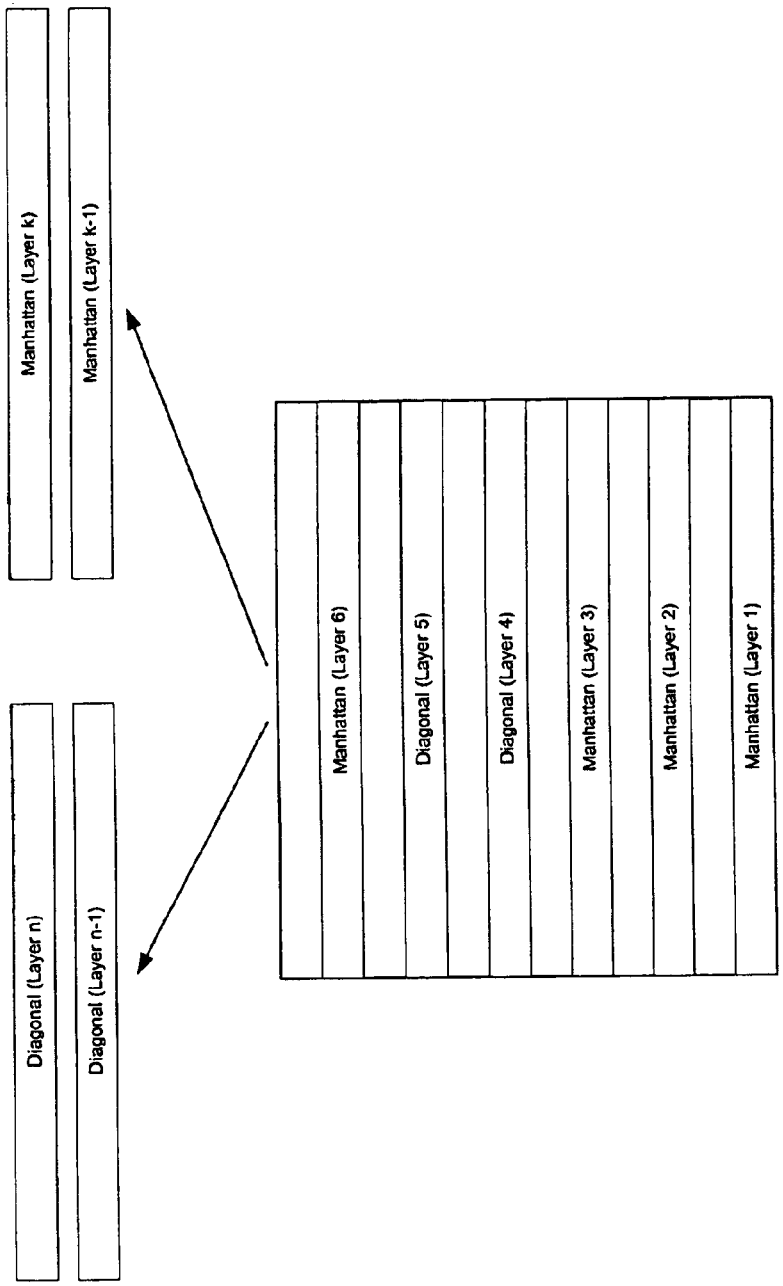
FIG. 8 illustrates another embodiment for combining diagonal wiring layers with legacy Manhattan layers.

FIG. 8 illustrates another embodiment for combining diagonal wiring layers with legacy Manhattan layers. As shown in FIG. 8, layers "1", "2" and "3" have a preferred Manhattan direction. In one embodiment, layer two is configured as the complement of layers "1" and "3." In one embodiment of FIG. 8, layers "4" and "5" consist of a complementary diagonal pair for the preferred wiring direction (i.e., either hexalinear or octalinear complementary pairs). In another embodiment, layers "4" and "5" consist of diagonal wiring directions that are not complementary.

Metal layer "6" has a preferred Manhattan wiring direction. In one embodiment, metal layer "6" has a preferred Manhattan wiring direction that complements the preferred Manhattan wiring direction of level three. For example, if the wiring directions of layers "1", "2" and "3" consist of a horizontal vertical-horizontal configuration, respectively, then Manhattan layer six has a preferred vertical direction. Or, if the wiring directions of layers "1", "2", and "3" consist of a vertical horizontal vertical configuration, respectively, then Manhattan layer "6" has a preferred horizontal direction. The configuration of adding a complementary Manhattan layer to level "6" (i.e., complementary to level "3") maximizes the availability of wiring in a direction opposite from level "3." FIG. 8 also illustrates additional embodiments for adding additional layers above layer "6." For this embodiment, additional layers may be added above layer "6" to form either diagonal complementary pairs at levels "n" and "n–1" or to form Manhattan complementary pairs at levels "k" and "k–1", wherein "n" and "k" are even integers, six or greater. Embodiments that employ single diagonal or Manhattan layer geometries are also shown. For example, layer 7 may employ a diagonal wiring geometry without a complementary diagonal wiring layer.

One advantage of the Manhattan and diagonal wiring geometries of FIG. 8 is that the transition in signal routing direction from a diagonal routing layer to a Manhattan routing layer is better leveraged. For example, to change direction from metal layer 5 to a vertical routing direction requires only routing the connection to metal layer 6, rather than routing the connection all the way down to metal layer "2." Because a substantial cost is incurred for routing between layers and a cost is incurred in switching routing directions by requiring a jump to a different layer, minimizing the cost of switching directions benefits the ease of design of the chip.

Figure 9:
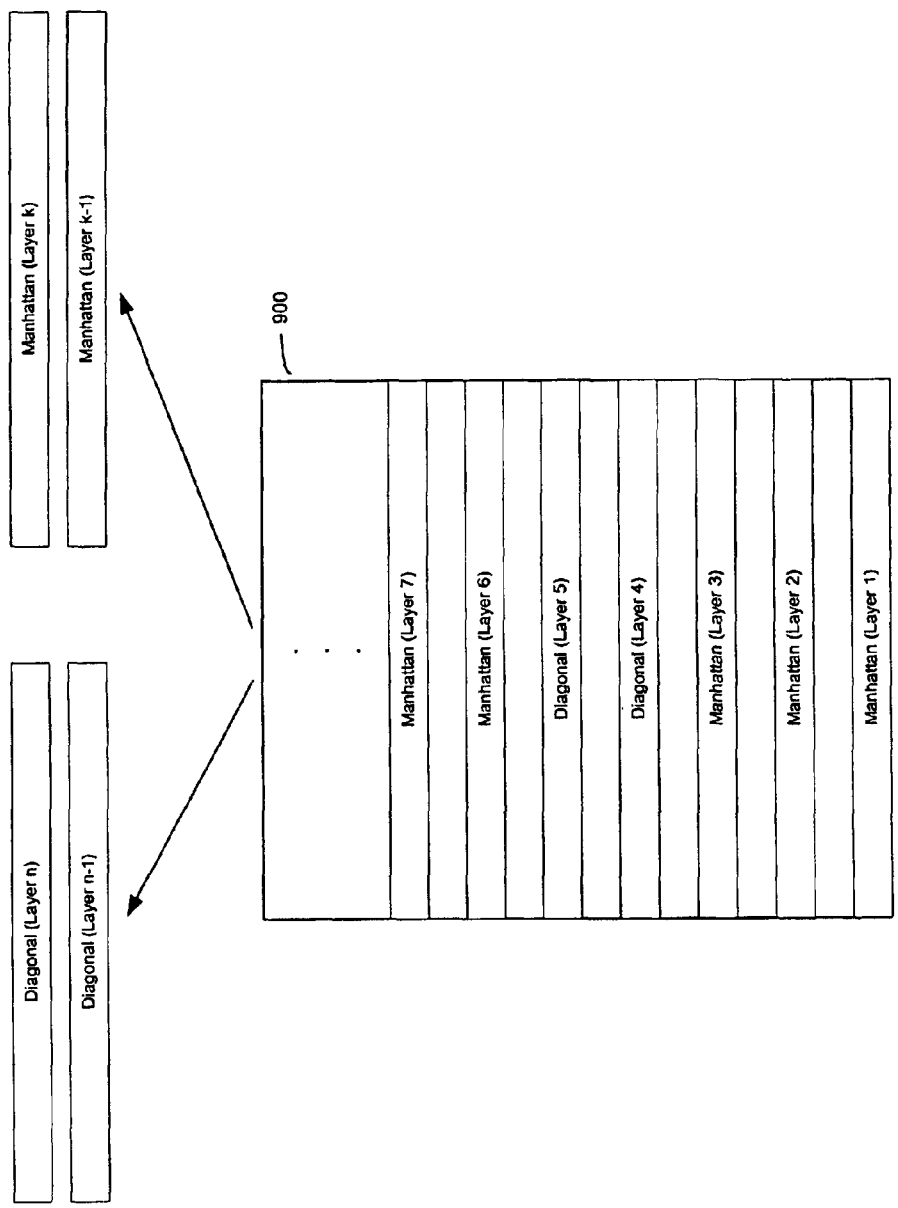
FIG. 9 illustrates another embodiment for combining diagonal wiring layers with legacy Manhattan layers.
Figure 10:
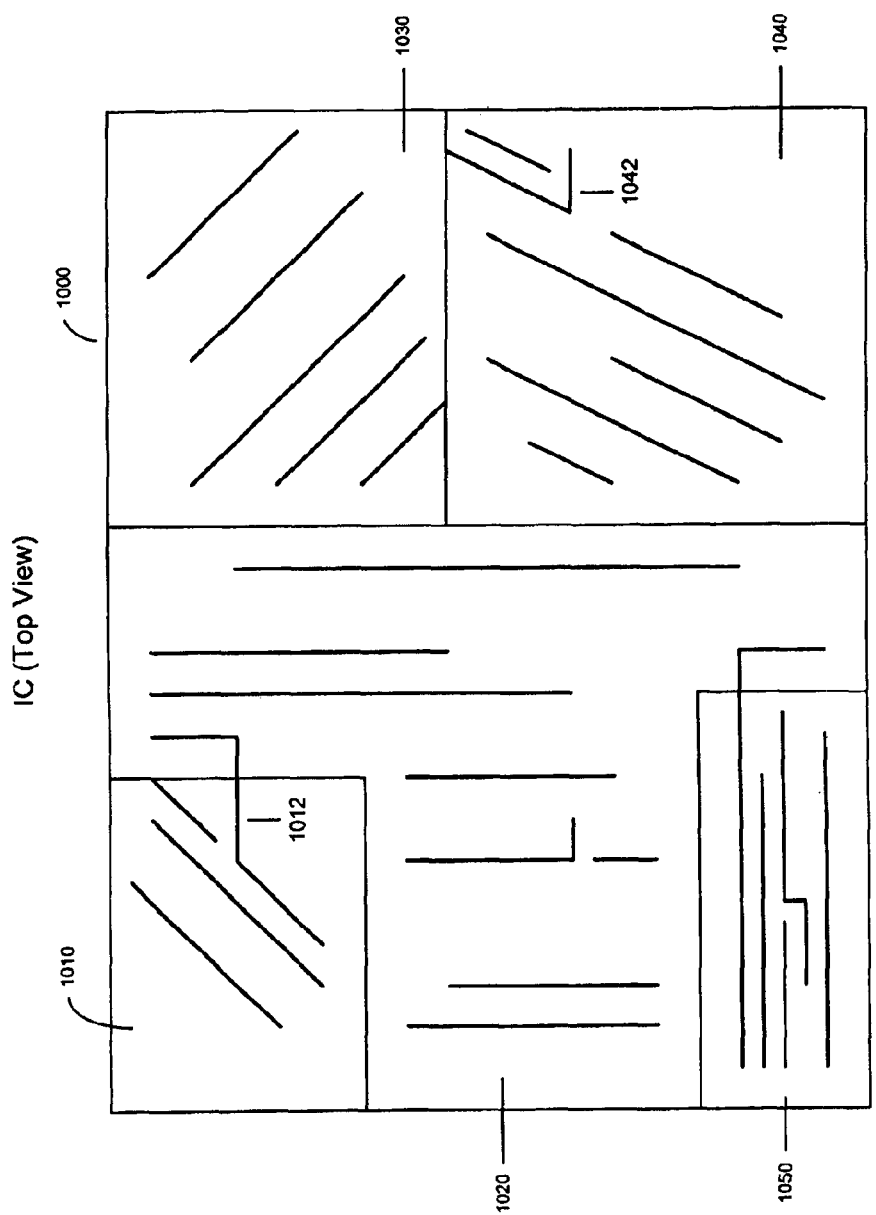
FIG. 10 illustrates an example metal layer with multiple preferred directions.

FIG. 9 illustrates another embodiment for combining diagonal wiring layers with legacy Manhattan layers. The first six layers of integrated circuit 900 are configured with preferred directions as the first six layers of FIG. 8. However, layer "7" has a preferred Manhattan direction that is complementary to the preferred Manhattan direction of layer "6.", This embodiment has the advantage of providing another complementary Manhattan layer above layer "6" to minimize routing distances between wires coupled between layers "6" and "7." As shown in FIG. 9, any combination of diagonal or Manhattan layers or complementary pairs of layers may be disposed above layer "7." FIG. 10 illustrates an example metal layer with multiple preferred directions. A metal layer may be divided into sections or blocks, such that each block or section has a preferred wiring direction. In FIG. 10, a top view of integrated circuit 1000 exposing a metal layer is shown. For this example, the metal layer is divided into five sections, labeled 1010, 1020, 1030, 1040 and 1050. Section 1010 has a preferred diagonal direction (i.e., a preferred direction of plus 45 degrees). Although section 1010 has a preferred octalinear direction, wire 1012 is disposed in a horizontal direction. Section 1030 also has a preferred octalinear direction of minus 45 degrees. Also, section 1040 has a preferred hexalinear direction of plus 60 degrees. For this example, wire 1042 is disposed in a horizontal direction. The example of FIG. 10 also includes Manhattan direction wiring for sections 1020 and 1050. Specifically, section 1020 has a preferred vertical direction, whereas section 1050 has a preferred horizontal direction. Similar to sections 1010 and 1040, sections 1020 and 1050 have wires disposed in a direction other then the preferred direction. For purposes of illustration, the sections shown in FIG. 10 include only a few wires. However, a section, as defined herein, is a contiguous area of the IC that contains at least one thousand wires.

An integrated circuit with multiple sections having different preferred directions has application for use in IP blocks. For example, an IP block may include four metal layers comprising Manhattan wiring geometries. For this example, the use of different preferred wiring directions in different sections permits implementing diagonal wiring geometries in areas of metal layer four outside the IP block. Other applications for implementing different preferred wiring directions in different sections may be realized.

Typically, pre-designed blocks ("IP blocks") integrated into integrated circuits require that metal layers disposed above the IP blocks do not route wires above those blocks. This requirement ensures that the operation of the IP blocks is not altered by noise coupled from metal layers above the IP blocks. For example, a memory, integrated as a pre-configured block, may be highly sensitive to voltage swings. To ensure proper operation of the memory block, a requirement may prohibit the placement of any wires above the memory block.

In general, diagonal wiring geometries provide noise immunity from Manhattan wiring geometries. The use of diagonal wiring in the present invention permits routing wires in areas above IP blocks. Since the IP blocks utilize Manhattan wiring geometries, the use of diagonal wires in metal layers above the IP blocks do not result in noise coupling between the wires on the metal layer(s) and the wires on the IP block. This supports a hierarchical design approach. In a hierarchical design approach, wires in a subsection of the IC are routed independent of other areas of the IC. For example, an IP block, with Manhattan directional wires routed independent of other portions of the IC, may be Integrated into an IC employing diagonal wires without noise coupling concerns.

Figure 11:
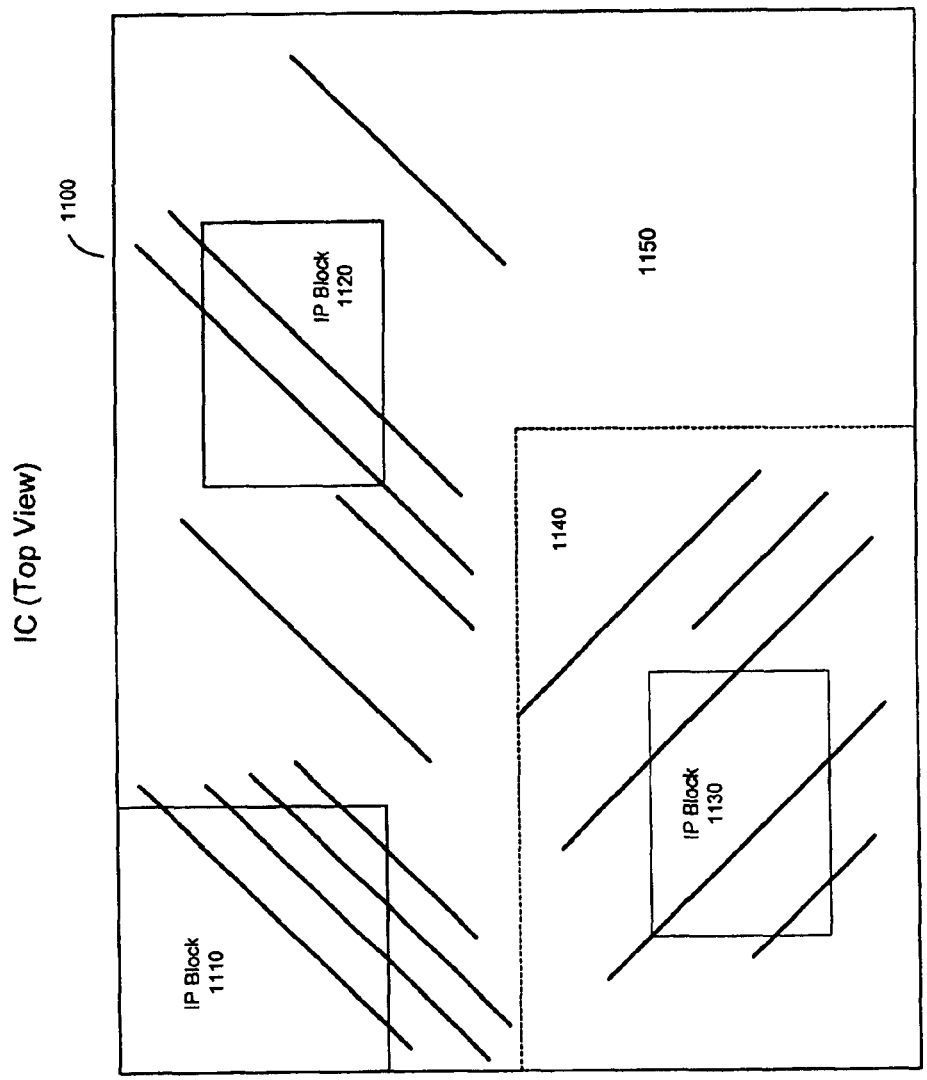
FIG. 11 is an example of using diagonal wiring in metal layers disposed above IP blocks.

FIG. 11 is an example of using diagonal wiring in metal layers disposed above IP blocks. For this example, an integrated circuit 1100 includes pre-configured or IP blocks 1110, 1120 and 1130. The IP blocks 1110, 1120 and 1130 are selfcontained within layers "1", "2"and "3"of integrated circuit 1100.

FIG. 11 shows a top view of a wiring layer above layer three (i.e., layer "4"or above). As shown in FIG. 11, the use of diagonal wiring permits routing diagonal wires above IP blocks 1110, 1120 and 1130. Because the preferred wiring direction in this metal layer is not either horizontal or vertical, electrical emanations from the diagonal wires do not directly coupled to the wire layers in the IP blocks, and thus do not cause a degradation in circuit performance. The wiring layer shown in FIG. 11 is also divided into two preferred wiring directions. Section 1150 has a plus 45 preferred wiring direction, and section 1140 has a preferred wiring direction of minus 45 degrees.

There are several advantages in using diagonal wiring geometries. When routing in Manhattan directions, the area reached with a given total wire length may be described as a diamond around the source of the wire. Assuming a wire length of one, a wire reaches a distance of +1 or −1 on the X or Y direction or along the edges connecting those points. This area within a distance of 1 creates the diamond shape. The total area of this region within routing distance "1" is two. The maximum distance from the center reached by a 45 degree direction is (0.5 times the square route of 2.0) (i.e., 0.5 in the X direction plus 0.5 in the Y direction reaches the center point).

When routing wires at 45 degrees, a distance of "1"from the center along the diagonals is reached. Thus, the use of diagonal wiring effectively extends the space reached by roots of length "1." The area of this region within routing distance 1 is 2.8284. If an area is larger within the same wiring distance of a point, then the total wire length on a chip is reduced, assuming the additional area within the same wiring distances is leveraged. If the wire length on integrated circuits is reduced, then: 1) the propagation delay through the shorter wires is less, reducing the complexity of the chip design; 2) the congestion encountered when routing wires on a chip is reduced if the total amount of wire on a chip is also reduced, thereby enhancing the design of the chip; and 3) the size of the integrated circuit chip may be reduced by reducing the total mount of wires on the chip, thus decreasing costs of manufacture.

One advantage in implementing wiring geometries where the lower metal layers employ Manhattan routing directions is to directly leverage existing design components in a new layout scheme. Typically, integrated circuits are generally composed of two types of logic blocks: small cells implementing simple logic functions, and large functional blocks to implement specific functionalities. The large blocks are used because they are much more efficient at implementing their specific functionality, as opposed to implementing the same functionality using a large number of small cells. These two types of logic blocks are generally implemented using the three metal layers configured in Manhattan wiring directions. Small cells typically employ metal layers "1", and in some cases, metal layer "2." Large logic blocks typically employ metal layers 1, 2, and 3. Thus, because existing wiring directions commonly in use today consist of Manhattan directions on metal layers 1, 2, and 3, there is an advantage in designing new integrated circuit chips with new wiring geometries that incorporate Manhattan layers. Thus, employing diagonal wiring geometries on metal layers of both metal layer 3 maintains compatibility with existing cell libraries in large functional blocks.

Figure 12A:
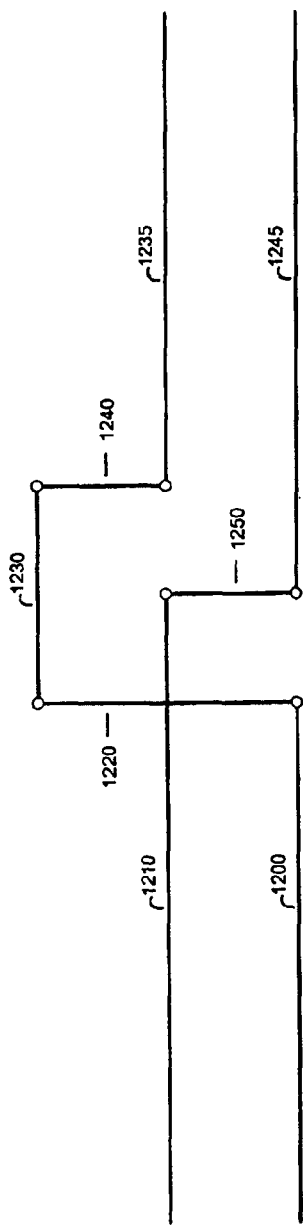
FIG. 12A illustrates a prior art configuration for routing two wires that switch tracks.

FIG. 12A illustrates a prior art configuration for routing two wires that switch tracks. For this example, wires 1210, 1200, 1235 and 1245 are routed on a single layer, with a preferred horizontal wiring direction. Specifically, a wire 1200 on a first layer switches tracks to wire 1235, also on the first layer. Wire 1210, also on the first layer, switches track to wire 1245 on that same layer. Using Manhattan wiring geometries, wire 1210 is routed to a different layer that employs a vertical wiring direction. Specifically, for this example, the routing on the vertical layer occurs on wire 1250. To connect wire 1245, a second via is used to jump from the vertical wiring layer of wire 1250 back to the horizontal wiring layer with wire 1245. As shown in FIG. 12A, 2 this routing requires two vias.

FIG. 12A also routes wire 1200 through a via to wire 1220 on a vertical layer. In additional, a via is used to route to wire 1220 to wire 1230, located on a horizontal layer. A further layer transition and via are required to route wire 1230 to wire 1240, located on a vertical layer. To complete the connection to the original horizontal layer, wire 1240 is coupled to wire 1235 using a fourth via. As illustrated by this example, a total of 6 vias are required to alternate tracks on a single layer.

Figure 12B:
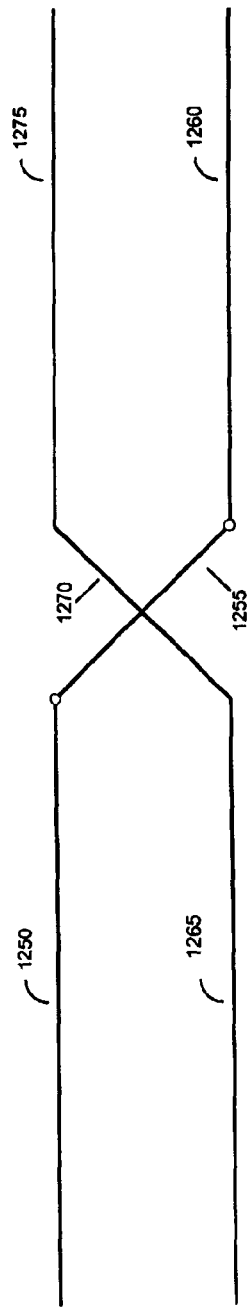
FIG. 12B illustrates an example for switching tracks using diagonal wiring.

FIG. 12B illustrates an example for switching tracks using diagonal wiring. Similar to FIG. 12A, wires 1250, 1260, 1265, and 1275 are deposed on a single layer, with a preferred horizontal wiring direction. For this example, to route wire 1265 to wire 1275, a single diagonal wire, 1270, is used. The diagonal wire in the example of FIG. 12B is defined as a zag. To route wire 1250 to wire 1260, a via is used to route the connection to diagonal wire 1255 and on a different layer. A second via couples wire 1255 to wire 1260 on the original layer.

Figure 13:
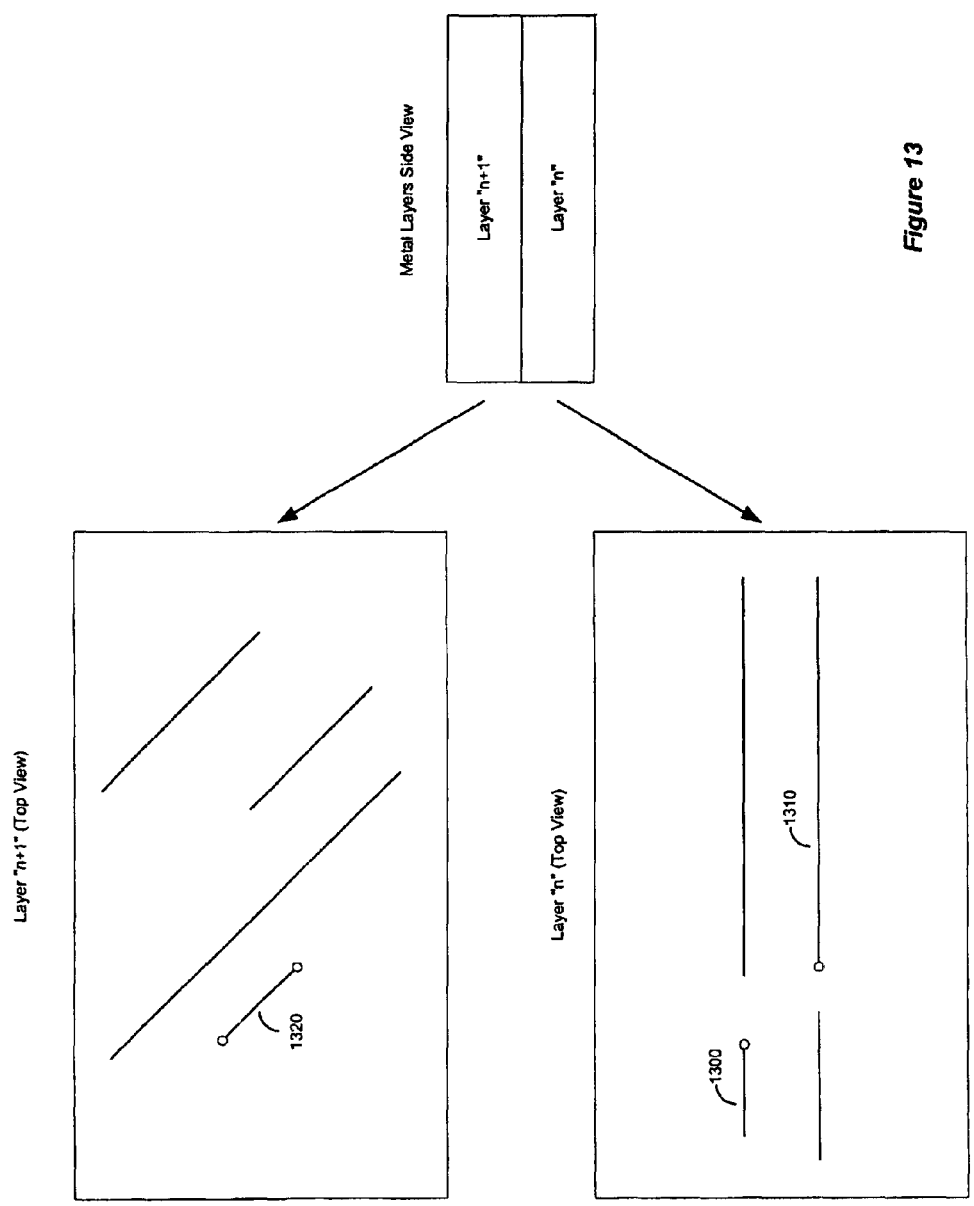
FIG. 13 Illustrates another embodiment for use of diagonal wiring in conjunction with Manhattan wiring.

FIG. 13 illustrates another embodiment for use of diagonal wiring in conjunction with Manhattan wiring. As shown in FIG. 13, layer "n"and layer "n+1"are adjacent metal layers. For this embodiment, layer "n" has wires deposed horizontally, and layer "n+1"has wires deposed diagonally. Wires 1300 and 1310 on layer "n"are connected through wire 1320 on layer "n+1"as shown.

As illustrated in FIGS. 12B and 13, using diagonal wiring, only two vias are required to switch tracks between two wires. In the prior art technique illustrated in FIG. 12A, a total of 6 vias on two additional layers were used to accomplish this.

Figure 14:
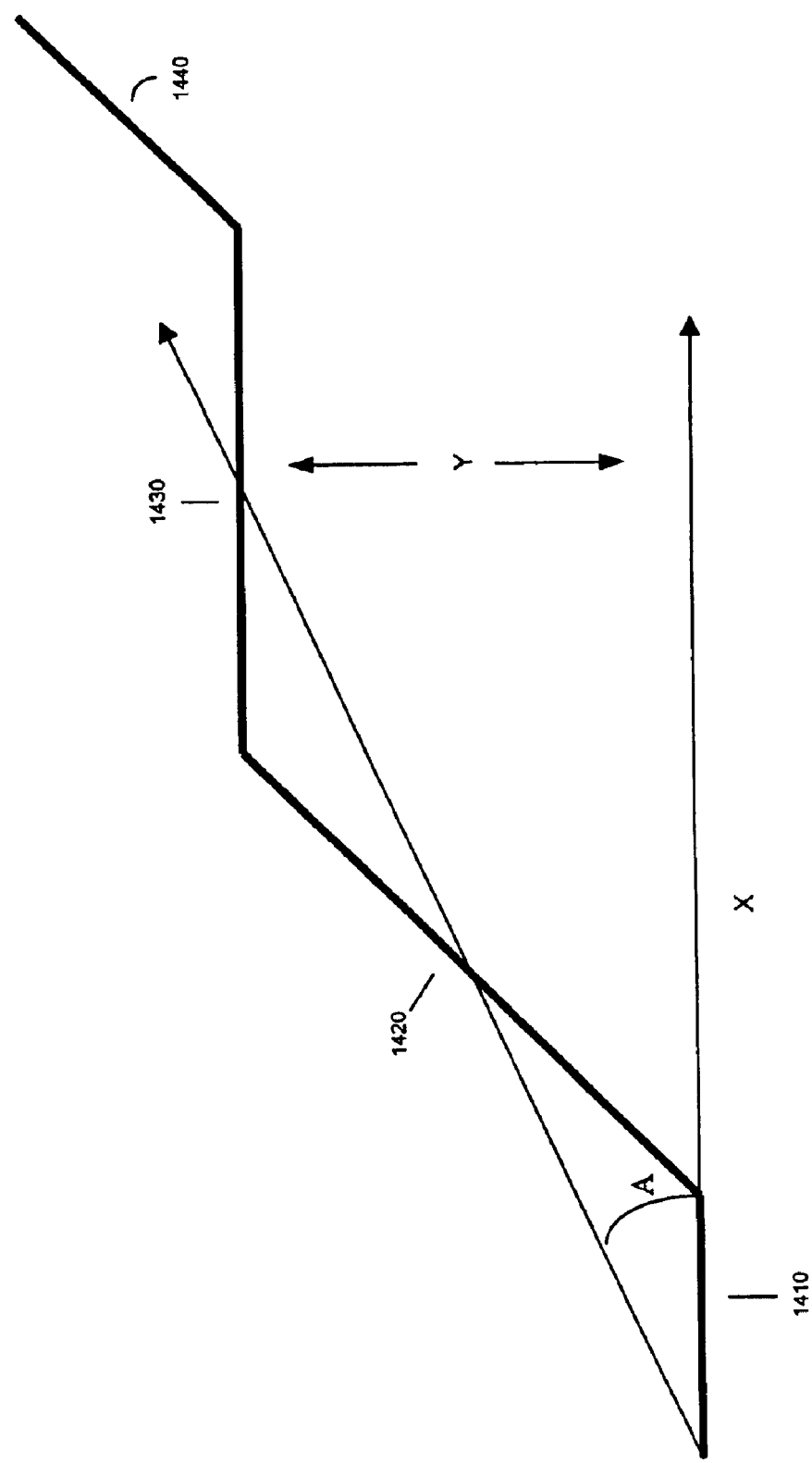
FIG. 14 illustrates one embodiment for a "zig-zag" wiring geometry.

As used herein, a "zig-zag" geometry connotes a combination of at least one wire deposed in a Manhattan direction coupled to at least one wire deposed in a diagonal direction. The use of zig-zag wiring permits simulating Euclidean directional wiring through use of Manhattan wiring and diagonal wiring (e.g., 45 degrees, 60 degrees, etc.). In one embodiment, a "zig-zag" geometry comprises pairs of a Manhattan wire connected to a diagonal wire. FIG. 14 illustrates one embodiment for a "zig-zag" wiring geometry. In general, any Euclidean wiring angle may be achieved by selection of the proper wire lengths for the Manhattan and diagonal wire combinations. The arrow in FIG. 14 designates the direction simulated by the zig-zag configuration. For the example of FIG. 14, wire 1410, deposed in a horizontal direction, is connected to wire 1420, deposed in a diagonal direction (e.g., 45 degrees). In turn, wire 1430, deposed in a horizontal direction, couples wire 1420 and wire 1440, deposed In a diagonal direction. The angle, A, is defined by the following relationship: Tan A=Y/X, wherein, Y is the vertical distance and X is the horizontal distance. Using this configuration of alternating horizontal and diagonal wires, any angle A may be obtained.

Figure 15:
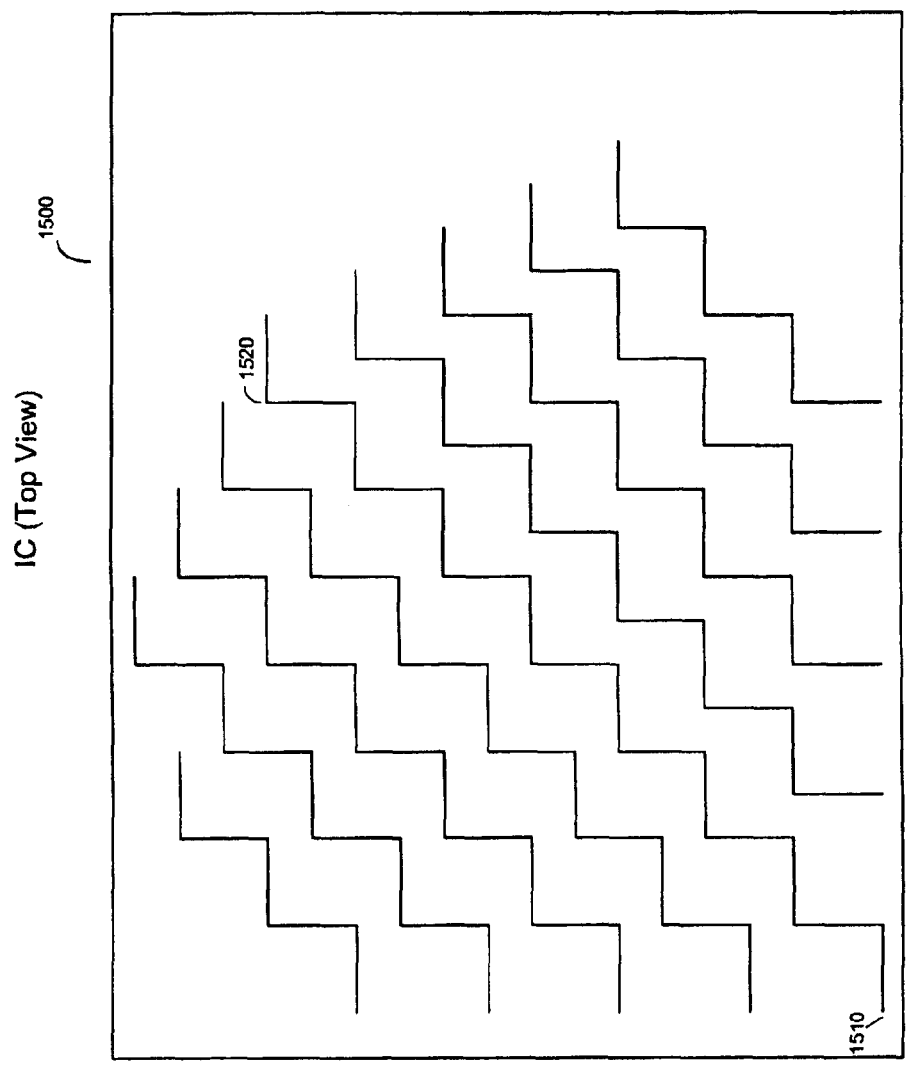
FIG. 15 illustrates an example metal layer that simulates diagonal wires with wires deposed in Manhattan directions.

Diagonal wiring may also be simulated with wires deposed in a purely horizontal and vertical direction. FIG. 15 illustrates an example metal layer that simulates diagonal wires with wires deposed in Manhattan directions. As shown in FIG. 15, a series of wires, arranged in tracks, form a diagonal direction. For this example, the angle between the point designated 1510 and the point designated 1520 is 45 degrees. This technique permits simulating a diagonal wiring direction, through horizontal and vertical wires, by selecting the appropriate lengths for the horizontal and vertical wires. Thus, any diagonal wiring direction may be simulated through this technique. In one embodiment, a plurality of horizontal and vertical wire routings on layer 1500 are situated in parallel to generate tracks of simulated diagonal wires as shown in FIG. 15.

Figure 16:
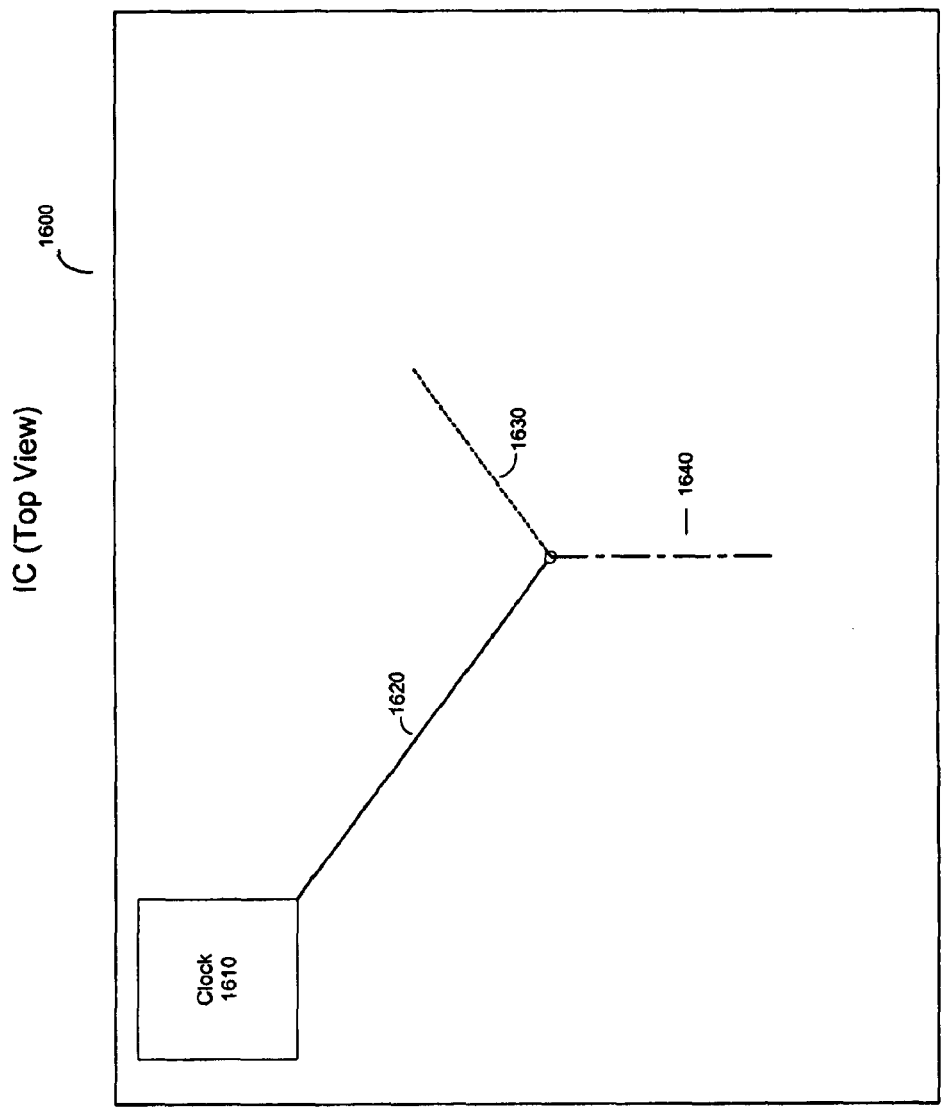
FIG. 16 illustrates an example of routing clock signals using diagonal wires.

The diagonal wiring geometries of the present invention also have application for use in routing clock signals. FIG. 16 illustrates an example of routing clock signals using diagonal wires. For this example, a clock 1610 generates a clock signal for timing on integrated circuit 1600. Wire 1620 conducts the clock signal from the clock 1610 on a first metal layer. In turn, wire 1630 carries the clock signal on a second layer, and wire 1640 carries the clock signal on a third layer.

The use of diagonal wiring to conduct clock signals significantly reduces the amount of power required to propagate the clock signal. In addition, the use of diagonal wiring reduces the length of wire necessary to conduct clock signals, thereby decreasing clock delay and clock skew.

Although the present Invention has been described in terms of specific exemplary embodiments, it will be appreciated that various modifications and alterations might be made by those skilled in the art without departing from the spirit and scope of the invention.

What is claimed is:

1. An integrated circuit comprising:
   at least one metal layer comprising at least one thousand conductors effectively deposed in an effective preferred direction to interconnect one or more points within the integrated circuit, the effective preferred direction comprising a direction for at least forty percent of the conductors on the metal layer;
   each particular conductor comprising:
      a first wire deposed in a first Manhattan direction relative to the boundaries of the integrated circuit, the first wire comprising first and second ends;
      a second wire deposed in a second Manhattan direction relative to the boundaries of the integrated circuit, the first Manhattan direction being different than the second Manhattan direction, the second wire comprising first and second ends, the first end of the second wire being coupled to the second end of the first wire;
   wherein each wire being a continuous segment deposed in a single direction; and
   wherein, the effective preferred direction of a particular conductor comprises an angle, A, measured relative to the boundaries of the integrated circuit, defined by the expression Tan A=Y/X,
   wherein, Y comprises a line segment with a distance starting from the second end of the second wire and ending at an intersection with a line segment propagated from the first end of the first wire and in the direction of the first wire, and X comprises a distance, measured in the direction of the first wire, starting from the first end of the first wire and ending with the intersection of the Y line segment.

2. The integrated circuit as set forth in claim 1, wherein the first Manhattan direction comprises a horizontal direction and the second Manhattan direction comprises a vertical direction.

3. The integrated circuit as set forth in claim 1, wherein the first Manhattan direction comprises a vertical direction and the second Manhattan direction comprises a horizontal direction.

4. The integrated circuit as set forth in claim 1, wherein the first wire length equals the second wire length so as to simulate an effective direction of 45 degrees.

5. The integrated circuit as set forth in claim 1, wherein the ratio of the first wire length to the second wire length equals three to two, so as to simulate an effective wiring direction of 60 degrees.

6. The integrated circuit as set forth in claim 1, wherein the metal layer comprises a plurality of independent conductors deposed in parallel.

7. An integrated circuit (IC) comprising:
   a metal layer;
   a set of at least ten routes on said metal layer;
   each particular route formed by two sets of wire segments that alternate along only two directions, each set of wire segments only having wire segments along one of said two directions, wherein said two directions are approximately perpendicular, wherein a ratio of the length of wire segments along one direction to the length of wire segments along the other direction is approximately equal for all said routes, wherein said ratio is selected such that said routes effectively traverse along said metal layer in a particular effective direction.

8. The IC of claim 7, wherein said set of at least ten routes on said metal layer comprises 1000 routes.

9. The IC of claim 7, wherein the first and second routes are parallel in that each of a set of wire segments in the first route is parallel to at least one wire segment in the second route.

* * * * *

UNITED STATES PATENT AND TRADEMARK OFFICE
CERTIFICATE OF CORRECTION

PATENT NO. : 6,900,540 B1
DATED : May 31, 2005
INVENTOR(S) : Steven Teig et al.

It is certified that error appears in the above-identified patent and that said Letters Patent is hereby corrected as shown below:

Title page,
Item [75], Inventors, "Akira Fujimura, Saratoga, CA (US)" should read
-- Akira Fujimura, Saratoga, CA (JP) --.

Column 1,
Line 60 to Column 2, Line 9 should be deleted.

Column 2,
Line 47 to Column 3, Line 6 should be deleted.

Column 3,
Lines 7-16, should be deleted.

Signed and Sealed this

Seventh Day of February, 2006

JON W. DUDAS
*Director of the United States Patent and Trademark Office*